US012751339B2

(12) United States Patent
Saito

(10) Patent No.: US 12,751,339 B2
(45) Date of Patent: Sep. 29, 2026

(54) SIGNAL TRANSMISSION DEVICE AND INSULATED MODULE

(71) Applicant: ROHM CO., LTD., Kyoto (JP)

(72) Inventor: Koji Saito, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 391 days.

(21) Appl. No.: 18/500,796

(22) Filed: Nov. 2, 2023

(65) Prior Publication Data

US 2024/0072031 A1 Feb. 29, 2024

Related U.S. Application Data

(63) Continuation of application No. PCT/JP2022/019530, filed on May 2, 2022.

(30) Foreign Application Priority Data

May 7, 2021 (JP) ................................ 2021-078989

(51) Int. Cl.
*H10W 90/00* (2026.01)
*H10D 86/85* (2025.01)
(Continued)

(52) U.S. Cl.
CPC ............ *H10W 90/00* (2026.01); *H10D 86/85* (2025.01); *H10W 90/811* (2026.01); (Continued)

(58) Field of Classification Search
CPC ............... H10W 90/00; H10W 90/811; H10W 72/5522; H10W 72/5524; H10W 72/5525; (Continued)

(56) References Cited

U.S. PATENT DOCUMENTS 7,884,776 B2 * 2/2011 Mohamadi ............... H01Q 3/30 343/853
9,105,391 B2 * 8/2015 Fouquet .............. H01F 27/2804
(Continued)

FOREIGN PATENT DOCUMENTS

DE 102004014752 B4 * 11/2008 ............ H10W 42/00
JP 2013051547 A * 3/2013 ............ H10W 90/00
(Continued)

OTHER PUBLICATIONS

International Search Report issued for International Patent Application No. PCT/JP2022/019530, Date of mailing: Jul. 12, 2022, 5 pages including English translation.
(Continued)

*Primary Examiner* — Mohammed Shamsuzzaman
(74) *Attorney, Agent, or Firm* — HSML P.C.

(57) ABSTRACT

A signal transmission device provided with an insulated chip. The insulated chip includes: an element insulating layer; and a first insulated element and a second insulated element which are provided in the element insulating layer. The first insulated element includes a first front-surface-side electrically conductive portion and a first back-surface-side electrically conductive portion. The second insulated element includes a second front-surface-side electrically conductive portion and a second back-surface-side electrically conductive portion. The first back-surface-side electrically conductive portion and the second back-surface-side electrically conductive portion are electrically connected to each other. The first front-surface-side electrically conductive portion is electrically connected to a primary-side circuit via the first pad. The second front-surface-side electrically conductive portion is electrically connected to a secondary-side circuit via the second pad.

15 Claims, 19 Drawing Sheets

(51) Int. Cl.
*H10W 72/00* (2026.01)
*H10W 72/50* (2026.01)
*H10W 72/90* (2026.01)

(52) U.S. Cl.
CPC .... *H10W 72/5522* (2026.01); *H10W 72/5524* (2026.01); *H10W 72/5525* (2026.01); *H10W 72/884* (2026.01); *H10W 72/932* (2026.01); *H10W 72/9415* (2026.01); *H10W 72/9445* (2026.01); *H10W 90/736* (2026.01); *H10W 90/753* (2026.01)

(58) Field of Classification Search
CPC ............. H10W 72/884; H10W 72/932; H10W 72/9415; H10W 72/9445; H10W 90/736; H10W 90/753; H10W 70/481; H10W 72/50; H10W 72/851; H10W 90/293; H10W 70/468; H10D 86/85; H10D 84/00; H01F 2027/2809; H01F 27/2804
See application file for complete search history.

(56) References Cited

U.S. PATENT DOCUMENTS

| | | | | |
|---|---|---|---|---|
| 2013/0055052 | A1 | 2/2013 | Kaeriyama | |
| 2014/0273825 | A1* | 9/2014 | Sapone | H10W 42/60 257/664 |
| 2014/0325322 | A1 | 10/2014 | Kaeriyama | |
| 2014/0374890 | A1* | 12/2014 | Yamashita | H10W 90/811 438/107 |
| 2015/0137314 | A1* | 5/2015 | Osada | H01F 27/288 257/531 |
| 2017/0148732 | A1* | 5/2017 | Kuwajima | H10W 20/497 |
| 2017/0287624 | A1 | 10/2017 | Osada et al. | |
| 2020/0203058 | A1 | 6/2020 | Osada et al. | |
| 2021/0233700 | A1 | 7/2021 | Osada et al. | |
| 2025/0380433 | A1* | 12/2025 | Toda | H10D 1/20 |

FOREIGN PATENT DOCUMENTS

| | | | | |
|---|---|---|---|---|
| JP | 2016028407 A | * | 2/2016 | H10W 90/811 |
| WO | WO-2022234848 A1 | * | 11/2022 | H10W 90/00 |

OTHER PUBLICATIONS

Written Opinion issued for International Patent Application No. PCT/JP2022/019530, Date of mailing: Jul. 12, 2022, 5 pages including English translation.
Notice of Reasons for Refusal issued for Japanese Patent Application No. 2023-518697, Dispatch date: May 12, 2026, 7 pages including English machine translation.

* cited by examiner

SIGNAL TRANSMISSION DEVICE AND INSULATED MODULE

BACKGROUND

The present disclosure relates to a signal transmission device and an insulated module.

An insulation gate driver that applies gate voltage to the gate of a switching element such as a transistor is one example of a gate driver. JP2013-51547A describes an example of a semiconductor integrated circuit that serves as an insulation gate driver including a transformer with a primary coil at a primary-side and a second coil at a secondary side.

DETAILED DESCRIPTION

Embodiments of a signal transmission device will now be described with reference to the drawings. The embodiments described below exemplify configurations and methods for embodying a technical concept without any intention to limit the material, shape, structure, arrangement, dimensions, and the like of each component. Elements in the figures are illustrated for simplicity and clarity and have not necessarily been drawn to scale. To facilitate understanding, hatching lines may not be shown in the cross-sectional drawings. The accompanying drawings illustrate exemplary embodiments in accordance with the present disclosure and are not intended to limit the present disclosure.

First Embodiment

Figure 1:
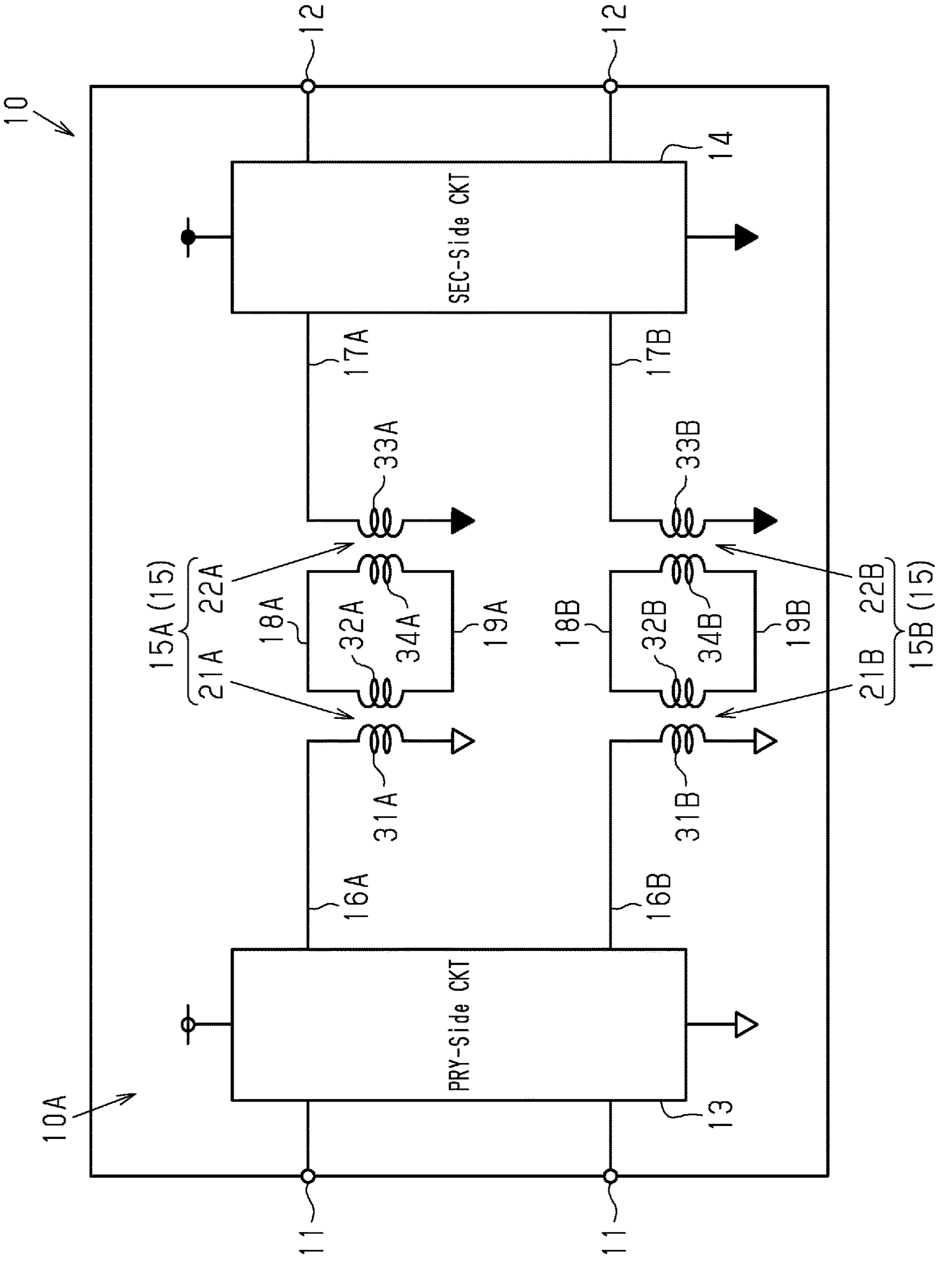
FIG. 1 is a circuit diagram schematically illustrating the circuit configuration of a signal transmission device in accordance with a first embodiment.

A signal transmission device 10 in accordance with a first embodiment will now be described with reference to FIGS. 1 to 6. FIG. 1 illustrates one example of the circuit configuration of the signal transmission device 10 in a simplified manner.

As shown in FIG. 1, the signal transmission device 10 electrically insulates a primary-side terminal 11 from a secondary-side terminal 12, while allowing a pulse signal to be transmitted therebetween. The signal transmission device 10 is a digital isolator, for example, a DC/DC converter. The signal transmission device 10 includes a signal transmission circuit 10A that includes a primary-side circuit 13 electrically connected to the primary-side terminal 11, a secondary-side circuit 14 electrically connected to the secondary-side terminal 12, and a transformer 15 electrically connected to the primary-side circuit 13 and the secondary-side circuit 14. In the present embodiment, the transformer 15 corresponds to an insulation element.

The primary-side circuit 13 is configured to be actuated when a first voltage is applied. The primary-side circuit 13 is electrically connected to, for example, an external controller (not shown).

The secondary-side circuit 14 is configured to be actuated when a second voltage, which differs from the first voltage is applied. The second voltage is, for example, higher than the first voltage. The first voltage and the second voltage are DC voltages. The secondary-side circuit 14 is electrically connected to, for example, a drive circuit that is controlled by the controller. One example of a drive circuit is a switching circuit.

When the primary-side terminal 11 receives a control signal from an external controller (not shown), the signal transmission device 10 of the present embodiment transmits a signal from the primary-side circuit 13 via the transformer 15 to the secondary-side circuit 14 and outputs the signal from the secondary-side circuit 14 via the secondary-side terminal 12 to the drive circuit.

As described above, the signal transmission circuit 10A electrically insulates the primary-side circuit 13 from the secondary-side circuit 14 with the transformer 15. In further detail, the transformer 15 restricts the transmission of DC voltage between the primary-side circuit 13 and the secondary-side circuit 14, while allowing for the transmission of a pulse signal therebetween.

A state in which the primary-side circuit 13 is insulated from the secondary-side circuit 14 refers to a state in which the transmission of DC voltage is impeded between the primary-side circuit 13 and the secondary-side circuit 14, and the transmission of a pulse signal is permitted between the primary-side circuit 13 and the secondary-side circuit 14.

The dielectric breakdown voltage of the signal transmission device 10 is, for example, in the range of 2500 Vrms to 7500 Vrms. The dielectric breakdown voltage of the signal transmission device 10 in the present embodiment is approximately 5000 Vrms. The dielectric breakdown voltage of the signal transmission device 10 is, however, not limited to any specific numerical value. In the present embodiment, the ground of the primary-side circuit 13 is independent from the ground of the secondary-side circuit 14. The transformer 15 will now be described in detail.

The signal transmission device 10 of the present embodiment transmits two types of signals from the primary-side circuit 13 to the secondary-side circuit 14 and includes two transformers 15 accordingly. In further detail, the signal transmission device 10 includes a transformer 15 used to transmit a first signal from the primary-side circuit 13 to the secondary-side circuit 14 and a transformer 15 used to transmit a second signal from the primary-side circuit 13 to the secondary-side circuit 14. In the present embodiment, the first signal includes rising information of the external signal input to the signal transmission device 10, and the second signal includes falling information of the external signal. The first signal and the second signal generate a pulse signal.

In the description hereafter, for the sake of clarity, the transformer 15 used to transmit the first signal will be referred to as the transformer 15A, and the transformer 15 used to transmit the second signal will be referred to as the transformer 15B. In the present embodiment, the transformer 15A corresponds to a first signal transformer, and the transformer 15B corresponds to a second signal transformer.

The signal transmission device 10 includes a primary-side signal line 16A, which connects the primary-side circuit 13 and the transformer 15A, and a primary-side signal line 16B, which connects the primary-side circuit 13 and the transformer 15B. Thus, the primary-side signal line 16A transmits a first signal from the primary-side circuit 13 to the transformer 15A. The primary-side signal line 16B transmits a second signal from the primary-side circuit 13 to the transformer 15B.

The signal transmission device 10 includes a secondary-side signal line 17A, which connects the transformer 15A and the secondary-side circuit 14, and a secondary-side signal line 17B, which connects the secondary-side circuit 14 and the transformer 15B. Thus, the secondary-side signal line 17A transmits a first signal from the transformer 15A to the secondary-side circuit 14. The secondary-side signal line 17B transmits a second signal from the transformer 15B to the secondary-side circuit 14.

The transformer 15A transmits a first signal from the primary-side circuit 13 to the secondary-side circuit 14, while electrically insulating the primary-side circuit 13 from the secondary-side circuit 14. The transformer 15A includes a first transformer 21A and a second transformer 22A that are connected in series to each other. In the present embodiment, the first transformer 21A corresponds to a first insulation element, and the second transformer 22A corresponds to a second insulation element.

The signal transmission device 10 includes two connecting signal lines 18A and 19A that connect the first transformer 21A and the second transformer 22A. Thus, the two connecting signal lines 18A and 19A transmit a first signal.

In the present embodiment, the dielectric breakdown voltage of the transformers 21A and 22A is, for example, in the range of 2500 Vrms to 7500 Vrms. The dielectric breakdown voltage of the transformers 21A and 22A may be in the range of 2500 Vrms to 5700 Vrms. The dielectric breakdown voltage of the transformers 21A and 22A may be changed.

The first transformer 21A includes a first coil 31A and a second coil 32A that is electrically insulated from the first coil 31A but can be magnetically coupled to the first coil 31A. The second transformer 22A includes a first coil 33A and a second coil 34A that is electrically insulated from the first coil 33A but can be magnetically coupled to the second coil 34A.

The first coil 31A is connected by the primary-side signal line 16A to the primary-side circuit 13 and further connected to the ground of the primary-side circuit 13. That is, the first end of the first coil 31A is electrically connected to the primary-side circuit 13, and the second end of the first coil 31A is electrically connected to the ground of the primary-side circuit 13.

The second coil 32A is connected by the two connecting signal lines 18A and 19A to the second coil 34A. In one example, the second coil 32A and the second coil 34A are connected to each other in an electrically floating state. The first end of the second coil 32A is connected to the first end of the second coil 34A by the connecting signal line 18A. The second end of the second coil 32A is connected to the second end of the second coil 34A by the connecting signal line 19A. In this manner, the second coil 32A and the second coil 34A serve as relay coils that relay a first signal of the first coil 31A and the first coil 33A.

The first coil 33A is connected by the secondary-side signal line 17A to the secondary-side circuit 14 and further connected to the ground of the secondary-side circuit 14. That is, the first end of the first coil 33A is electrically connected to the secondary-side circuit 14, and the second end of the first coil 33A is electrically connected to the ground of the secondary-side circuit 14.

The transformer 15B transmits a second signal from the primary-side circuit 13 to the secondary-side circuit 14, while electrically insulating the primary-side circuit 13 from the secondary-side circuit 14. The transformer 15B includes a first transformer 21B and a second transformer 22B that are connected in series to each other. In the present embodiment, the first transformer 21B corresponds to a first insulation element, and the second transformer 22B corresponds to a second insulation element.

The signal transmission device 10 includes two connecting signal lines 18B and 19B that connect the first transformer 21B and the second transformer 22B. Thus, the two connecting signal lines 18B and 19B transmit a second signal.

The first transformer 21B includes a first coil 31B and a second coil 32B that is electrically insulated from the first coil 31B but can be magnetically coupled to the first coil 31B. The second transformer 22B includes a first coil 33B and a second coil 34B that is electrically insulated from the first coil 33B but can be magnetically coupled to the second coil 34B. The dielectric breakdown voltage of the first transformer 21B is the same as the dielectric breakdown voltage of the first transformer 21A, and the dielectric breakdown voltage of the second transformer 22B is the same as the dielectric breakdown voltage of the second transformer 22A. The connecting configuration of the first transformer 21B and the second transformer 22B is the same as that of the first transformer 21A and the second transformer 22A and thus will not be described in detail.

A first signal output from the primary-side circuit 13 is transmitted via the first transformer 21A and the second transformer 22A to the secondary-side circuit 14. A second signal output from the primary-side circuit 13 is transmitted via the first transformer 21B and the second transformer 22B to the secondary-side circuit 14.

Figure 2:
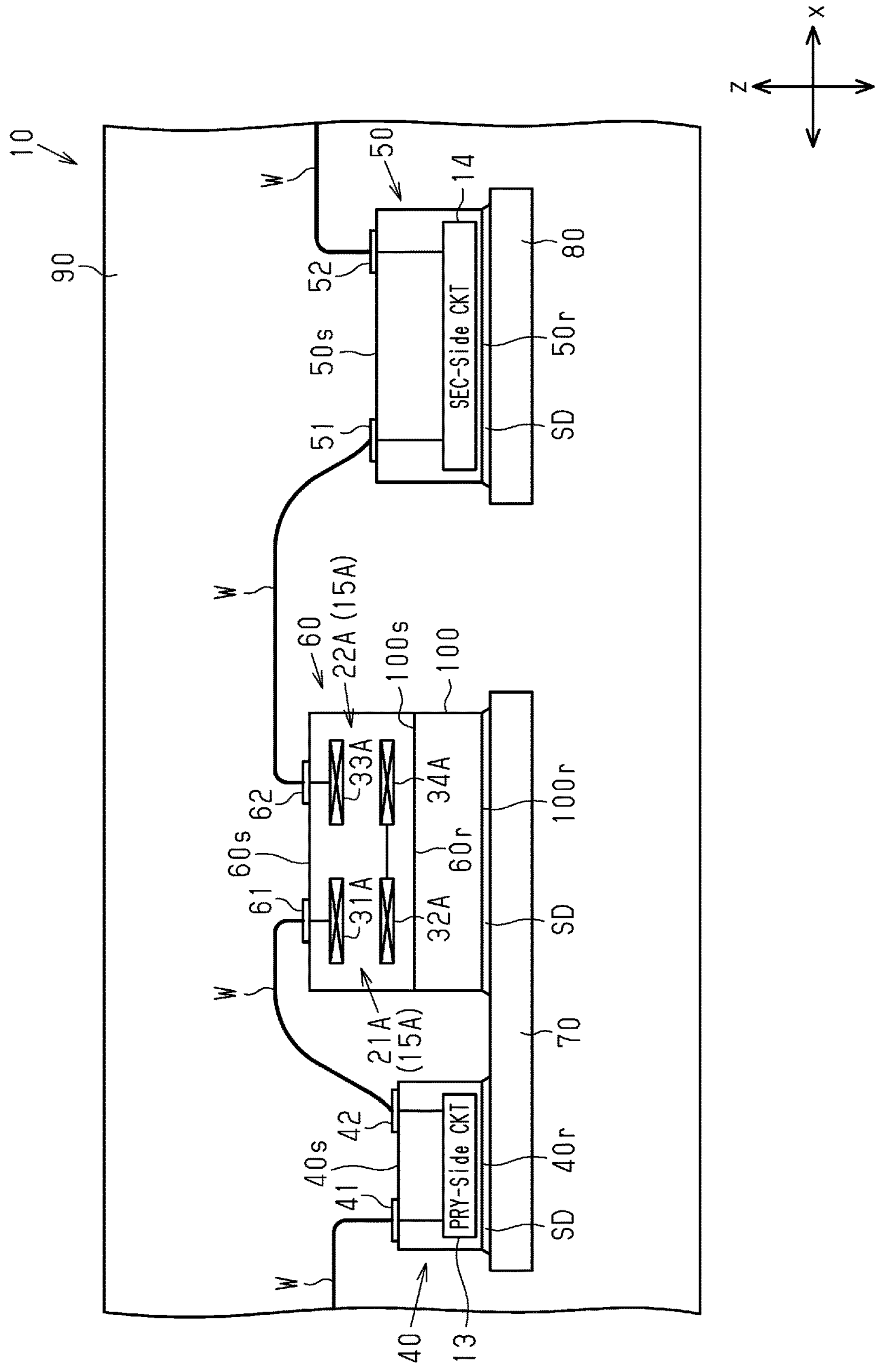
FIG. 2 is a cross-sectional view schematically illustrating the cross-sectional structure of the signal transmission device shown in FIG. 1.

FIG. 2 is a cross-sectional view schematically illustrating part of the internal structure of the signal transmission device 10. As shown in FIG. 2, the signal transmission device 10 is a single package of semiconductor chips. Although not shown in the drawings, the package of the signal transmission device 10 is of a small outline (SO) type, in the present embodiment, a small outline package (SOP). The signal transmission device 10 may be of any package type.

The signal transmission device 10 includes semiconductor chips, namely, a first chip 40, a second chip 50, and a transformer chip 60. The signal transmission device 10 also includes a primary-side die pad 70 on which the first chip 40 is mounted, a secondary-side die pad 80 on which the second chip 50 is mounted, and an encapsulation resin 90 in which the die pads 70 and 80 and the chips 40, 50, and 60 are encapsulated. In the present embodiment, the transformer chip 60 corresponds to an insulation chip.

The encapsulation resin 90 is formed from an electrically insulative material, for example, a black epoxy resin. The encapsulation resin 90 has the form of a rectangular plate of which the thickness direction is the z-direction.

The primary-side die pad 70 and the secondary-side die pad 80 are both formed from a material containing a conductor. In the present embodiment, the die pads 70 and 80 are formed from a material containing copper (Cu). The die pads 70 and 80 may be formed from another metal material such as aluminum (Al).

The primary-side die pad 70 and the secondary-side die pad 80 are separated from each other as viewed in the z-direction. As viewed in the z-direction, the direction in which the primary-side die pad 70 and the secondary-side die pad 80 are arranged is referred to as the x-direction. As viewed in the z-direction, the direction orthogonal to the x-direction is referred to as the y-direction. In the present embodiment, the x-direction corresponds to a first direction, and the y-direction corresponds to a second direction.

The primary-side die pad 70 and the secondary-side die pad 80 both have a flat form. In the present embodiment, the primary-side die pad 70 and the secondary-side die pad 80 are each rectangular as viewed in the z-direction. As viewed in the z-direction, the die pads 70 and 80 have short sides extending in the x-direction and long sides extending in the y-direction. In the present embodiment, the area of the primary-side die pad 70 as viewed in the z-direction is greater than the area of the secondary-side die pad 80 as viewed in the z-direction. The die pads 70 and 80 may have any shape as viewed in the z-direction. In one example, as viewed in the z-direction, the primary-side die pad 70 has long sides extending in the x-direction and short sides extending in the y-direction.

The first chip 40 and the transformer chip 60 are both mounted on the primary-side die pad 70. The second chip 50 is mounted on the secondary-side die pad 80. The chips 40, 50, and 60 are separated from one another in the x-direction. In the present embodiment, the chips 40, 50, and 60 are arranged in the order of the first chip 40, the transformer chip 60, and the second chip 50 in the x-direction from the primary-side die pad 70 toward the secondary-side die pad 80. In other words, the transformer chip 60 is located between the first chip 40 and the second chip 50 in the x-direction. In the present embodiment, the die pads 70 and 80 are not exposed to the outside from the encapsulation resin 90.

The first chip 40 includes the primary-side circuit 13. As viewed in the z-direction, the first chip 40 is rectangular and has short sides and long sides. As viewed in the z-direction, the first chip 40 is mounted on the primary-side die pad 70 so that the short sides extend in the x-direction and the long sides extend in the y-direction. The first chip 40 includes a chip main surface 40*s* and a chip back surface 40*r* at opposite sides in the z-direction. The chip back surface 40*r* of the first chip 40 is bonded by a conductive bonding material, such as a silver (Ag) paste, to the primary-side die pad 70.

First electrode pads 41 and second electrode pads 42 are arranged on the chip main surface 40*s* of the first chip 40. The electrode pads 41 and 42 are electrically connected to the primary-side circuit 13.

The first electrode pads 41 are located on the chip main surface 40*s* at the side opposite to the transformer chip 60 with respect to the middle of the chip main surface 40*s* in the x-direction. Although not shown in the drawings, the first electrode pads 41 are separated from each other in the y-direction. The second electrode pads 42 are located on the chip main surface 40*s* at the side located closer to the transformer chip 60 with respect to the middle of the chip main surface 40*s* in the x-direction. Although not shown in the drawings, the second electrode pads 42 are separated from each other in the y-direction.

The second chip 50 includes the secondary-side circuit 14. As viewed in the z-direction, the second chip 50 is rectangular and has short sides and long sides. As viewed in the z-direction, the second chip 50 is mounted on the secondary-side die pad 80 so that the short sides extend in the x-direction and the long sides extend in the y-direction. The second chip 50 includes a chip main surface 50*s* and a chip back surface 50*r* at opposite sides in the z-direction. The chip back surface 50*r* of the second chip 50 is bonded by the conductive bonding material SD to the secondary-side die pad 80.

First electrode pads 51 and second electrode pads 52 are arranged on the chip main surface 50*s* of the second chip 50. The electrode pads 51 and 52 are electrically connected to the secondary-side circuit 14.

The first electrode pads 51 are located on the chip main surface 50*s* at the side located closer to the transformer chip 60 with respect to the middle of the chip main surface 50*s* in the x-direction. Although not shown in the drawings, the first electrode pads 51 are separated from each other in the y-direction. The second electrode pads 52 are located on the chip main surface 50*s* at the side opposite to the transformer chip 60 with respect to the middle of the chip main surface 50*s* in the x-direction. Although not shown in the drawings, the second electrode pads 42 are separated from each other in the y-direction.

The transformer chip 60 includes the two transformers 15A and 15B. As viewed in the z-direction, the transformer chip 60 is rectangular and includes long sides and short sides. In the present embodiment, as viewed in the z-direction, the transformer chip 60 is mounted on the primary-side die pad 70 so that the long sides extend in the y-direction and the short sides extend in the x-direction.

The transformer chip 60 is located next to the first chip 40 in the x-direction. The die pads 70 and 80 have to be separated from each other so that the dielectric breakdown voltage of the signal transmission device 10 becomes set at the preset dielectric breakdown voltage. Thus, in the present embodiment, as viewed in the z-direction, the distance between the second chip 50 and the transformer chip 60 is greater than the distance between the first chip 40 and the transformer chip 60. In other words, the transformer chip 60 is located closer to the first chip 40 than to the second chip 50.

The transformer chip 60 includes a chip main surface 60*s* and a chip back surface 60*r* at opposite sides in the z-direction. The chip main surface 60*s* faces the same direction as the chip main surface 40*s* of the first chip 40, and the chip back surface 60*r* faces the same direction as the chip back surface 40*r* of the first chip 40.

An insulation plate 100 is located between the transformer chip 60 and the primary-side die pad 70. Thus, the insulation plate 100 is mounted on the primary-side die pad 70, and the transformer chip 60 is mounted on the insulation plate 100.

The insulation plate 100 is formed by an insulation substrate containing alumina or an insulation substrate containing glass. Further, the insulation plate 100 may be formed from an insulative resin. For example, the insulative resin is applied to the chip back surface 60*r* of the transformer chip 60. In this case, the insulative resin (i.e., insulation plate 100) is integrated with the transformer chip 60.

As viewed in the z-direction, the insulation plate 100 is rectangular and includes long sides and short sides. In the present embodiment, as viewed in the z-direction, the insulation plate 100 is mounted on the primary-side die pad 70 so that the long sides extend in the y-direction and the short sides extend in the x-direction. In the present embodiment, the insulation plate 100 has the same size as the transformer chip 60 as viewed in the z-direction. The insulation plate 100 may have any size as viewed in the z-direction. In one example, the insulation plate 100 may be larger in size than the transformer chip 60 as viewed in the z-direction.

The insulation plate 100 includes a main surface 100*s* and a back surface 100*r* facing opposite directions. The main surface 100*s* faces the same direction as the chip main surface 60*s* of the transformer chip 60, and the back surface 100*r* faces the same direction as the chip back surface 60*r* of the transformer chip 60. The back surface 100*r* of the insulation plate 100 is bonded by the conductive bonding material SD to the primary-side die pad 70. The transformer chip 60 is mounted on the main surface 100*s* of the insulation plate 100. In this manner, the transformer chip 60 is mounted on the insulation plate 100. Thus, the height of the chip main surface 60*s* of the transformer chip 60 from the primary-side die pad 70 is higher than both the height of the chip main surface 40*s* of the first chip 40 from the primary-side die pad 70 and the height of the chip main surface 50*s* of the second chip 50 from the secondary-side die pad 80.

The transformer chip 60 includes first electrode pads 61 and second electrode pads 62. The first electrode pads 61 and the second electrode pads 62 are arranged on the chip main surface 60*s*. In further detail, as viewed in the z-direction, the first electrode pads 61 and the second electrode pads 62 are exposed to the outside from the chip main surface 60*s*. The first electrode pads 61 are located closer to the first chip 40 than to the middle of the transformer chip 60 in the x-direction. The second electrode pads 62 are located closer to the second chip 50 than to the middle of the transformer chip 60 in the x-direction.

Wires W are connected to each of the first chip 40, the transformer chip 60, and the second chip 50. The wires W are bonding wires formed by a wire bonding device from a material including, for example, gold (Au), aluminum (Al), copper (Cu), or the like.

The first electrode pads 41 of the first chip 40 are connected to primary-side leads (not shown) by wires W. The primary-side leads are components of the primary-side terminal 11 shown in FIG. 1 and are formed from the same material as the primary-side die pad 70. The primary-side leads are spaced apart and extended across the encapsulation resin 90 at the side of the primary-side die pad 70 opposite the secondary-side die pad 80. The primary-side leads partially project out of the encapsulation resin 90. This electrically connects the primary-side circuit 13 to the primary-side terminal 11.

The second electrode pads 42 of the first chip 40 are connected to the first electrode pads 61 of the transformer chip 60 by wires W. This electrically connects the primary-side circuit 13 to the transformers 21A and 21B (refer to FIG. 1). The second electrode pads 62 of the transformer chip 60 are connected to the first electrode pads 51 of the second chip 50 by wires W. This electrically connects the transformers 22A and 22B (refer to FIG. 1) to the secondary-side circuit 14.

The second electrode pads 52 of the second chip 50 are connected to secondary-side leads (not shown) by wires W. The secondary side leads are components of the secondary-side terminal 12 shown in FIG. 1 and are formed from the same material as the secondary-side die pad 80. The secondary-side leads are spaced apart and extended across the encapsulation resin 90 at the side of the secondary-side die pad 80 opposite the primary-side die pad 70. The secondary-side leads project out of the encapsulation resin 90. This electrically connects the secondary-side circuit 14 to the secondary-side terminal 12.

One example of the internal structure of the transformer chip 60 will now be described with reference to FIGS. 3 to 6.

Figure 3:
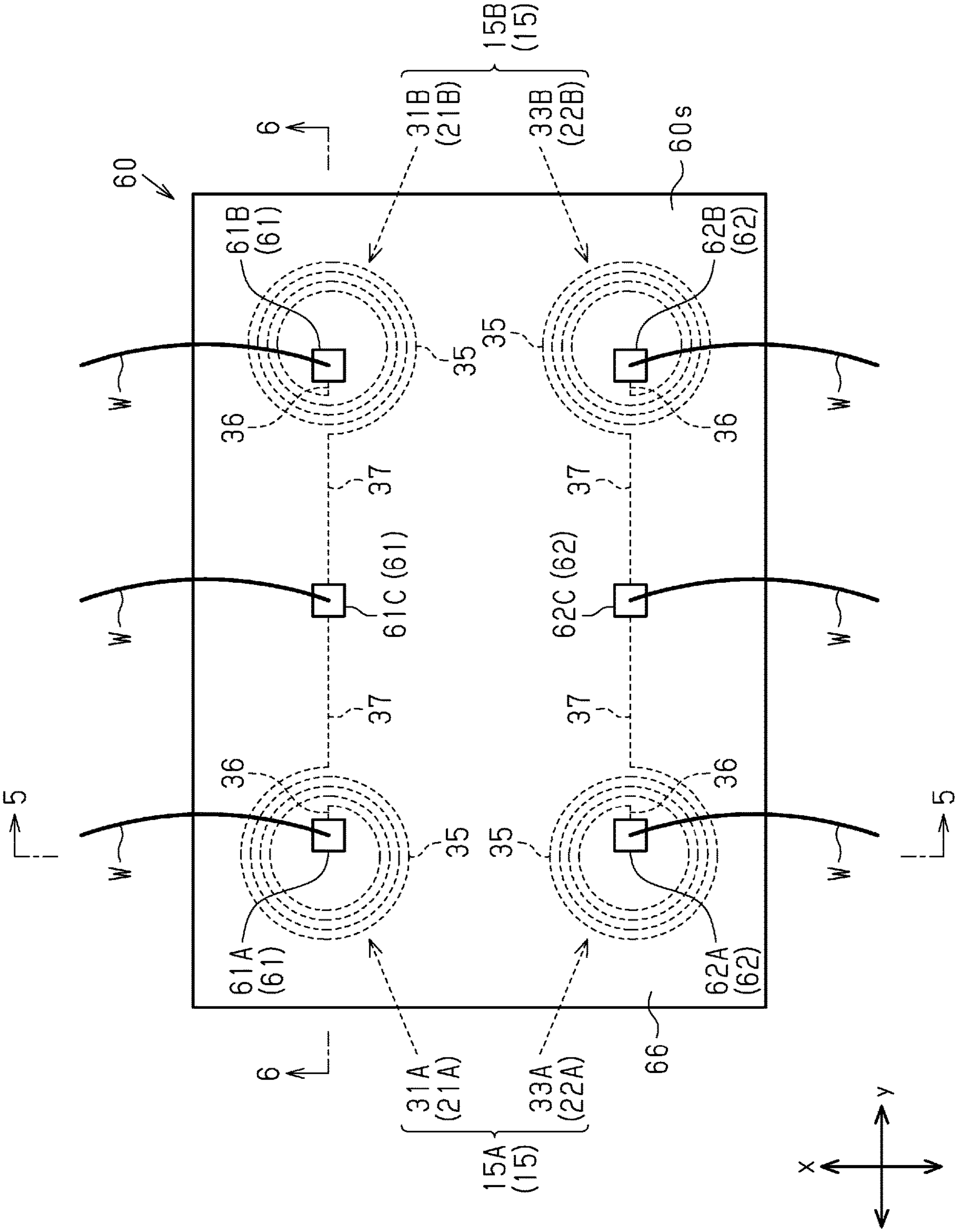
FIG. 3 is a plan view schematically illustrating the planar structure of a transformer chip of the signal transmitter shown in FIG. 2.
Figure 4:
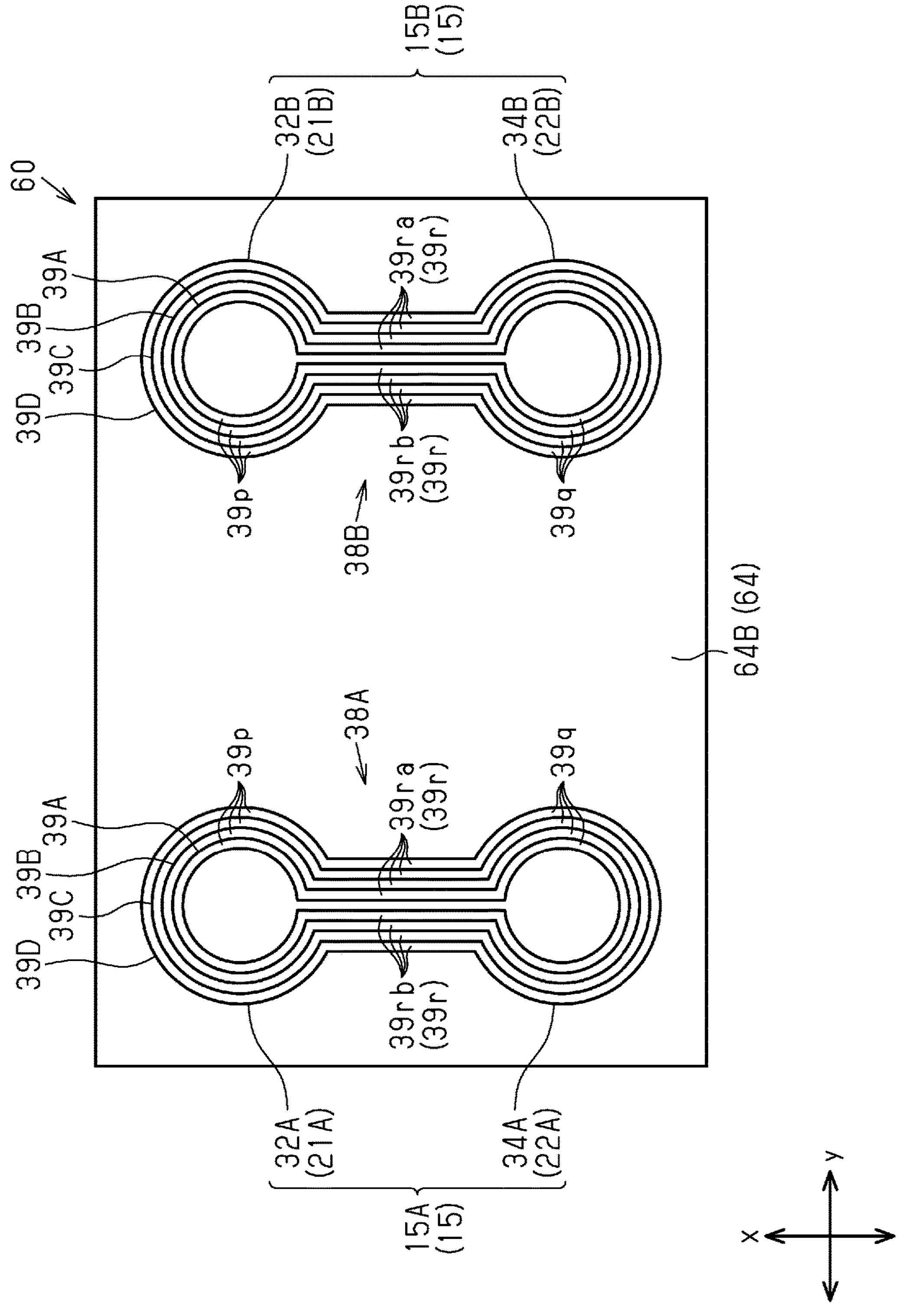
FIG. 4 is a cross-sectional view schematically illustrating the cross-sectional structure of the transformer chip shown in FIG. 3 taken along a plane orthogonal to the thickness direction of the transformer chip.
Figure 5:
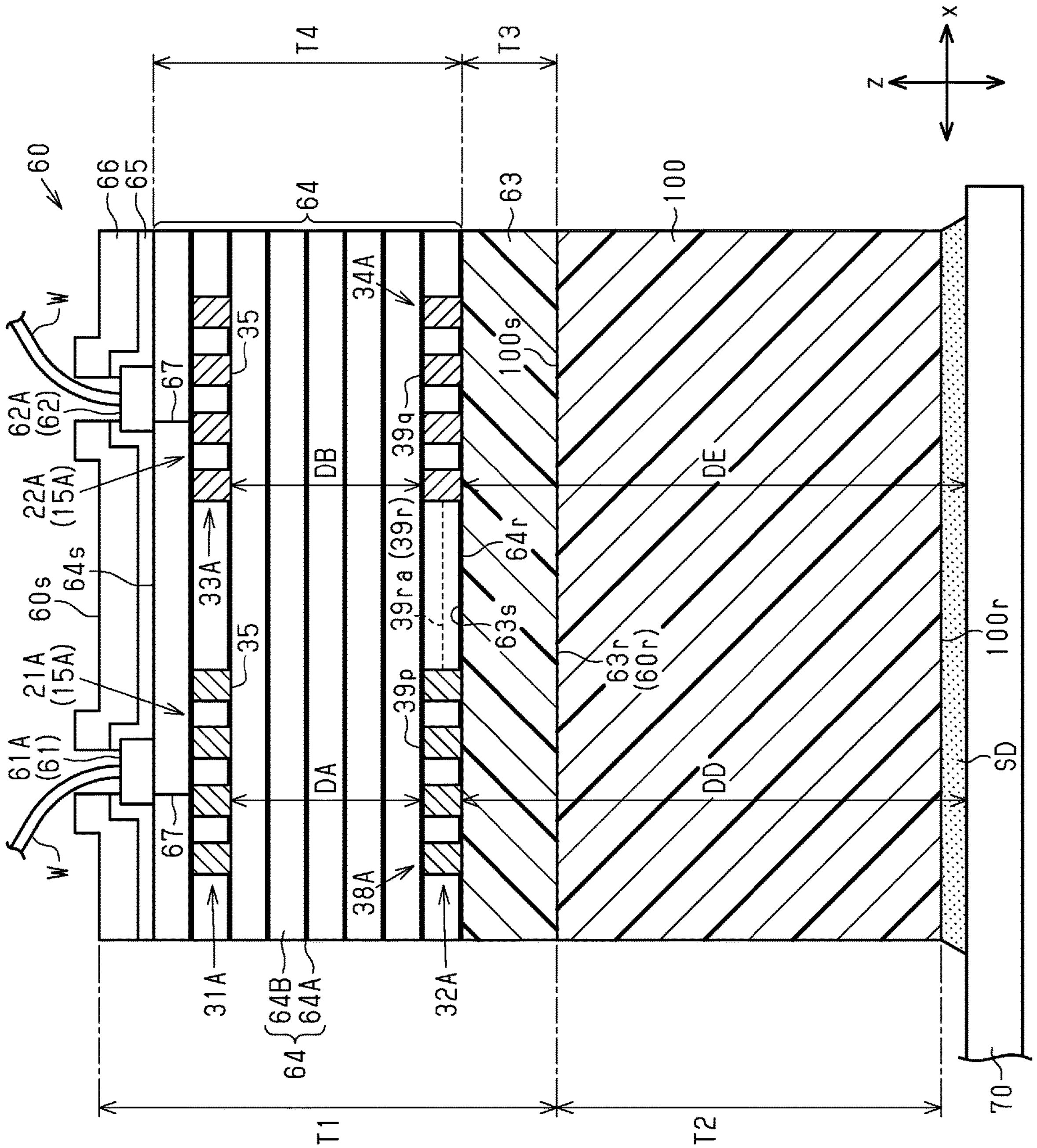
FIG. 5 is a cross-sectional view schematically illustrating the cross-sectional structure of the transformer chip taken along line 5-5 in FIG. 3.
Figure 6:
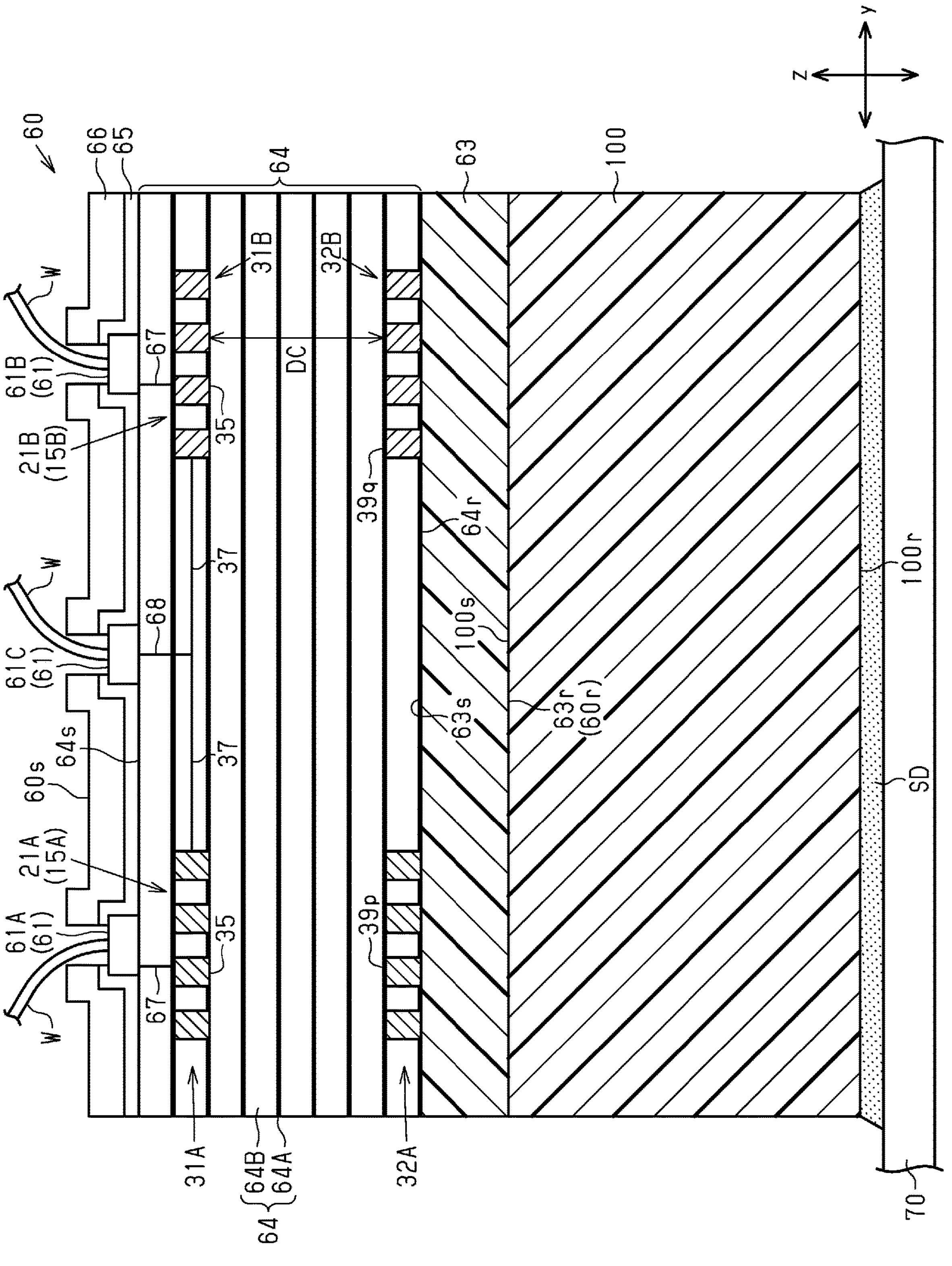
FIG. 6 is a cross-sectional view schematically illustrating the cross-sectional structure of the transformer chip taken along line 6-6 in FIG. 3.

FIG. 3 is a plan view schematically illustrating the planar structure of the transformer chip 60. FIG. 4 is a cross-sectional view schematically illustrating the cross-sectional structure taken along an xy plane in the transformer chip 60. Hatching lines are not shown in FIG. 4 to aid understanding. FIGS. 5 and 6 illustrate the cross-sectional structure of the transformer chip 60 in a state in which the transformer chip 60 is mounted on the primary-side die pad 70. FIGS. 5 and 6 schematically show the cross-sectional structure of the transformer chip 60 that includes a stack of element insulation layers 64, which will be described later. The number of stacked element insulation layers 64 is not limited to that illustrated in FIGS. 5 and 6. Further, FIGS. 5 and 6 schematically show the coils 31A, 31B, 32A, 32B, 33A, and 34A and thus are not in conformance with the coils 31A, 31B, 32A, 32B, 33A, and 34A shown in FIG. 3. FIGS. 5 and 6 do not show a first end 36, which will be described later.

In the description hereafter, the direction from the chip back surface 60*r* toward the chip main surface 60*s* of the transformer chip 60 will be referred to as the upward direction, and the direction from the chip main surface 60*s* toward the chip back surface 60*r* will be referred to as the downward direction.

As shown in FIGS. 3 to 6, the transformer chip 60 includes the two transformers 15A and 15B. More specifically, the transformer chip 60 packages the two transformers 15A and 15B into a single chip. Thus, the transformer chip 60 is separate from the first chip 40 and the second chip 50 and dedicated to the two transformers 15A and 15B.

With reference to FIG. 3, as viewed in the z-direction, the transformers 21A and 21B are located closer to the first chip 40 (refer to FIG. 2) than to the middle of the transformer chip 60 in the x-direction. As viewed in the z-direction, the transformers 22A and 22B are located closer to the second chip 50 (refer to FIG. 2) than to the middle of the transformer chip 60 in the x-direction. The first transformer 21A and the first transformer 21B are located at the same position in the x-direction and separated from each other in the y-direction. The second transformer 22A and the second transformer 22B are located at the same position in the x-direction and separated from each other in the y-direction. The first transformer 21A and the second transformer 22A are located at the same position in the y-direction and separated from each other in the x-direction. The first transformer 21B and the second transformer 22B are located at the same position in the y-direction and separated from each other in the x-direction.

As a result of the positional relationship of the transformers 21A, 21B, 22A, and 22B, the first coil 31A (31B) of the first transformer 21A (21B) and the first coil 33A (33B) of the second transformer 22A (22B) are separated by a gap in the x-direction (first direction). The first coil 31A of the first transformer 21A and the first coil 31B of the first transformer 21B are separated by a gap in the y-direction (second direction). The first coil 33A of the second transformer 22A and the first coil 33B of the second transformer 22B are separated by a gap in the y-direction (second direction).

As shown in FIGS. 3, 5, and 6, the first coil 31A, the first coil 31B, the first coil 33A, and the first coil 33B are located at the same position in the z-direction. The coils 31A, 31B, 33A, and 33B are formed from a material containing one or more of titanium (Ti), titanium nitride (TiN), Au, Ag, Cu, Al, and tungsten (W). In the present embodiment, the coils 31A, 31B, 33A, and 33B are formed from a material containing Cu.

In the present embodiment, the coils 31A, 31B, 33A, and 33B are identical in shape. The coils 31A, 31B, 33A, and 33B each include a coil portion 35, which has a spiral form, the first end 36, which extends inward from the coil portion 35, and a second end 37, which extends outward from the coil portion 35. The first end 36 of each of the coils 31A and 31B is electrically connected to the primary-side circuit 13 (refer to FIG. 1), and the second end 37 of each of the coils 31A and 31B is electrically connected to the ground of the primary-side circuit 13. The first end 36 of each of the coils 33A and 33B is electrically connected to the secondary-side circuit 14 (refer to FIG. 1), and the second end 37 of each of the coils 33A and 33B is electrically connected to the ground of the secondary-side circuit 14.

As shown in FIG. 3, in the present embodiment, a plurality of (three in present embodiment) first electrode pads 61 are connected to the first coils 31A and 31B of each of the transformers 21A and 21B. A plurality of (three in the present embodiment) second electrode pads 62 are connected to the first coils 33A and 33B of the transformers 22A and 22B. The first electrode pads 61 are located on the chip main surface 60*s* closer to the first chip 40 (refer to FIG. 2) than to the middle of the chip main surface 60*s* in the x-direction. The first electrode pads 61 are separated from each other in the y-direction. The second electrode pads 62 are located on the chip main surface 60*s* closer to the second chip 50 (refer to FIG. 2) than to the middle of the chip main surface 60*s* in the x-direction. The electrode pads 61 and 62 are formed from, for example, a material containing Al.

The first electrode pads 61 overlap the first end 36 of each of the first coils 31A and 31B as viewed in the y-direction. The second electrode pads 62 overlap the first end 36 of each of the first coils 33A and 33B in the y-direction. In the description hereafter, to aid understanding, the three first electrode pads 61 will be referred to as the first electrode pads 61A, 61B, and 61C, and the three second electrode pads 62 will be referred to as the second electrode pads 62A, 62B, and 62C. In the present embodiment, the first electrode pads 61A and 61B each correspond to a first pad, and the first electrode pad 61C corresponds to a third pad. The second electrode pads 62A and 62B each correspond to a second pad, and the second electrode pad 62C corresponds to a fourth pad.

As viewed in the z-direction, the first electrode pad 61A is located away from the center of the first coil 31A. The center of the first coil 31A is the center of the coil portion 35 of the first coil 31A. That is, the center of the first coil 31A is the winding center of the first coil 31A. As shown in FIG. 3, in the present embodiment, as viewed in the z-direction, the first electrode pad 61A does not overlap the center of the first coil 31A. Thus, the magnetic flux generated by the first coil 31A reduces the eddy current produced at the first electrode pad 61A.

As viewed in the z-direction, the first electrode pad 61A is located inward from the coil portion 35 of the first coil 31A. In other words, the coil portion 35 of the first coil 31A surrounds the first electrode pad 61A. That is, the first electrode pad 61A is located inside the first coil 31A. In the present embodiment, the first electrode pad 61A is located inside the first coil 31A away from the center of the first coil 31A. The first electrode pad 61A is electrically connected to the first end 36 of the first coil 31A.

As viewed in the z-direction, the first electrode pad 61B is located away from the center of the first coil 31B. The center of the first coil 31B is the center of the coil portion 35 of the first coil 31B. That is, the center of the first coil 31B is the winding center of the first coil 31B. As shown in FIG. 3, in the present embodiment, as viewed in the z-direction, the first electrode pad 61B does not overlap the center of the first coil 31B. Thus, the magnetic flux generated by the first electrode pad 61B reduces the eddy current produced at the first coil 31B.

As viewed in the z-direction, the first electrode pad 61B is located inward from the coil portion 35 of the first coil 31B. In other words, the coil portion 35 of the first coil 31B surrounds the first electrode pad 61B. That is, the first electrode pad 61B is located inside the first coil 31B. In the present embodiment, the first electrode pad 61B is located inside the first coil 31B away from the center of the first coil 31B. The first electrode pad 61B is electrically connected to the first end 36 of the first coil 31B.

As viewed in the z-direction, the first electrode pad 61C is located between the coil portion 35 of the first coil 31A and the coil portion 35 of the first coil 31B in the y-direction. As viewed in the z-direction, the first electrode pad 61C is located between the first electrode pad 61A and the first electrode pad 61B in the y-direction. In the present embodiment, the first electrode pads 61A, 61B, and 61C are located at the same position in the x-direction and separated from each other in the y-direction. The first electrode pad 61C is electrically connected to the second end 37 of the first coil 31A and the second end 37 of the first coil 31B.

As viewed in the z-direction, the second electrode pad 62A is located away from the center of the first coil 33A. The center of the first coil 33A is the center of the coil portion 35 of the first coil 33A. That is, the center of the first coil 33A is the winding center of the first coil 33A. As shown in FIG. 3, in the present embodiment, As viewed in the z-direction, the second electrode pad 62A does not overlap the center of the first coil 33A. Thus, the magnetic flux generated by the second electrode pad 62A reduces the eddy current produced at the first coil 33A.

As viewed in the z-direction, the second electrode pad 62A is located inward from the coil portion 35 of the first coil 33A. In other words, the coil portion 35 of the first coil 33A surrounds the second electrode pad 62A. That is, the second electrode pad 62A is located inside the first coil 33A. In the present embodiment, the second electrode pad 62A is located inside the first coil 33A away from the center of the first coil 33A. The second electrode pad 62A is electrically connected to the first end 36 of the first coil 33A.

As viewed in the z-direction, the second electrode pad 62B is located away from the center of the first coil 33B. The center of the first coil 33B is the center of the coil portion 35 of the first coil 33B. That is, the center of the first coil 33B is the winding center of the first coil 33B. As shown in FIG. 3, in the present embodiment, as viewed in the z-direction, the second electrode pad 62B does not overlap the center of the first coil 33B. Thus, the magnetic flux generated by the second electrode pad 62B reduces the eddy current produced at the first coil 33B.

As viewed in the z-direction, the second electrode pad 62B is located inward from the coil portion 35 of the first coil 33B. In other words, the coil portion 35 of the first coil 33B surrounds the second electrode pad 62B. That is, the second electrode pad 62B is located inside the first coil 33B. In the present embodiment, the second electrode pad 62B is located inside the first coil 33B away from the center of the first coil 33B. The second electrode pad 62B is electrically connected to the first end 36 of the first coil 33B.

As viewed in the z-direction, the second electrode pad 62C is located between the coil portion 35 of the first coil 33A and the coil portion 35 of the first coil 33B in the y-direction. As viewed in the z-direction, the second electrode pad 62C is located between the second electrode pad 62A and the second electrode pad 62B in the y-direction. In the present embodiment, the second electrode pads 62A, 62B, 62C are located at the same position in the x-direction and separated from each other in the y-direction. The second electrode pad 62C is electrically connected to the second end 37 of the first coil 33A and the second end 37 of the first coil 33B.

In the present embodiment, the first electrode pad 61A and the second electrode pad 62A are located at the same position in the y-direction and separated from each other in the x-direction. The first electrode pad 61B and the second electrode pad 62B are located at the same position in the y-direction and separated from each other in the x-direction. The first electrode pad 61C and the second electrode pad 62C are located at the same position in the y-direction and separated from each other in the x-direction. The positional relationship of the electrode pads 61A to 61C and the electrode pads 62A to 62C is not limited to the positional relationship of the electrode pads 61A to 61C and the electrode pads 62A to 62C shown in FIG. 3 and may be changed.

As shown in FIG. 4, the second coil 32A and the second coil 34A are integrated with each other into a first coil 38A. In further detail, the first coil 38A includes a first looped conductive portion 39A, a second looped conductive portion 39B, a third looped conductive portion 39C, and a fourth looped conductive portion 39D. The first looped conductive portion 39A, the second looped conductive portion 39B, the third looped conductive portion 39C, and the fourth looped conductive portion 39D are similar in shape. The second looped conductive portion 39B surrounds the first looped conductive portion 39A, the third looped conductive portion 39C surrounds the second looped conductive portion 39B, and the fourth looped conductive portion 39D surrounds the third looped conductive portion 39C. In the present embodiment, there are four looped conductive portions, namely, the first to fourth looped conductive portions 39A to 39D. This, however, is not a limitation. There may be any number of looped conductive portions.

The first looped conductive portion 39A includes a first opposing portion 39*p*, a second opposing portion 39*q*, and a connection portion 39*r*. The first opposing portion 39*p*, the second opposing portion 39*q*, and the connection portion 39*r* are integrated. The integrated first opposing portion 39*p*, the second opposing portion 39*q*, and the connection portion 39*r* form a loop. The first opposing portion 39*p* and the second opposing portion 39*q* are located at the same position in the y-direction and separated from each other in the x-direction.

The first opposing portion 39*p* faces the first coil 31A in the z-direction and forms the second coil 32A. As viewed in the z-direction, the first opposing portion 39*p* has an annular shape and is open in the x-direction at a part located toward the second opposing portion 39*q*.

The second opposing portion 39*q* faces the first coil 33A in the z-direction and forms the second coil 34A. As viewed in the z-direction, the second opposing portion 39*q* has an annular shape and is open in the x-direction at a part located toward the first opposing portion 39*p*. In this manner, as viewed in the z-direction, the first opposing portion 39*p* and the second opposing portion 39*q* are annular and open toward each other.

The connection portion 39*r* connects the first opposing portion 39*p* and the second opposing portion 39*q*. The connection portion 39*r* includes a first connection portion 39*ra* and a second connection portion 39*rb*. The first connection portion 39*ra* connects a first open end, or open annular first end part, of the first opposing portion 39*p* to a first open end, or open annular first end part, of the second opposing portion 39*q*. The second connection portion 39*rb* connects a second open end, or open annular second end part, of the first opposing portion 39*p* to a second open end, or open annular second end part, of the second opposing portion 39*q*. That is, the connection portion 39*r* connects the open ends of the two opposing portions 39*p* and 39*q*. The connection portions 39*ra* and 39*rb* each extend straight in the x-direction. In the same manner, the second to fourth looped conductive portions 39B to 39D each include the first opposing portion 39*p*, the second opposing portion 39*q*, and the connection portion 39*r*.

The second coil 32B and the second coil 34B are integrated with each other into a second coil 38B. The second coil 38B and the first coil 38A are identical in shape. Thus, the second coil 38B will not be described in detail. The second coils 32A, 32B, 34A, and 34B are formed from a material containing one or more of Ti, TiN, Au, Ag, Cu, Al, and W. In the present embodiment, the second coils 32A, 32B, 34A, and 34B are formed from a material containing Al.

In the present embodiment, the first coil 31A and the second coil 32A have the same number of windings (number of first opposing portions 39$p$). In the present embodiment, the coil portion 35 of the first coil 31A has an outer diameter equal to that of the second coil 32A. The outer diameter of the second coil 32A is the outer diameter of the fourth looped conductive portion 39D of the first opposing portion 39$p$ (refer to FIG. 4). The first coil 31B and the second coil 32B have the same relationship as the first coil 31A and the second coil 32A.

As shown in FIG. 3, in the present embodiment, the coil portion 35 of the first coil 31A is wound in the same direction as the coil portion 35 of the first coil 31B. The coil portion 35 of the first coil 33A is wound in the same direction as the coil portion 35 of the first coil 33B. Thus, as shown in FIG. 3, the first coil 33A and the first coil 33B are point symmetric about the second electrode pad 62C. Further, the first coil 31A and the first coil 31B are point symmetric about the first electrode pad 61C.

As shown in FIGS. 5 and 6, the transformer chip 60 includes a substrate 63 and the element insulation layers 64, which are formed on the substrate 63.

The substrate 63 is formed by, for example, a semiconductor substrate. In the present embodiment, the substrate 63 is formed from a material containing silicon (Si). The substrate 63 may be a semiconductor substrate of a wide bandgap semiconductor or a compound semiconductor. Further, instead of a semiconductor substrate, an insulation substrate formed from a material including glass may be used as the substrate 63.

A wide bandgap semiconductor is a semiconductor substrate having a bandgap of 2.0 eV or greater. The wide bandgap semiconductor may be silicon carbide (SiC). A compound semiconductor may be a III-V compound semiconductor. The compound semiconductor may contain at least one of aluminum nitride (AlN), indium nitride (InN), gallium nitride (GaN), and gallium arsenide (GaAs).

The semiconductor substrate 63 includes a substrate head surface 63$s$ and a substrate back surface 63$r$ at opposite sides in the z-direction. The substrate back surface 63$r$ defines the chip back surface 60$r$ of the transformer chip 60. Thus, the substrate back surface 63$r$ is bonded to the main surface 100$s$ of the insulation plate 100.

In the present embodiment, the element insulation layers 64 are stacked in the z-direction on the substrate head surface 63$s$ of the substrate 63. Thus, the z-direction is also the thickness direction of the element insulation layers 64. In the present embodiment, the overall thickness of the element insulation layers 64 is greater than that of the substrate 63. The stacked number of the element insulation layers 64 is determined in accordance with the dielectric breakdown voltage required for the transformer chip 60. Thus, the overall thickness of the element insulation layers 64 may be less than that of the substrate 63 depending on the number of the element insulation layers 64 that are stacked.

The element insulation layers 64 each include a first insulation film 64A and a second insulation film 64B, which is formed on the first insulation film 64A.

The first insulation film 64A is, for example, an etching stopper film formed from a material containing silicon nitride (SiN), SiC, silicon carbon nitride (SiCN), or the like. In the present embodiment, the first insulation film 64A is formed from a material containing SiN. The second insulation film 64B is, for example, an interlayer insulation film formed from a material containing silicon oxide ($SiO_2$). As shown in FIGS. 5 and 6, the second insulation film 64B is thicker than the first insulation film 64A. The first insulation film 64A may have a thickness in the range of 100 nm to 1000 nm. The second insulation film 64B may have a thickness in the range of 1000 nm to 3000 nm. In the present embodiment, the thickness of the first insulation film 64A is, for example, approximately 300 nm, and the thickness of the second insulation film 64B is approximately 2000 nm.

The first electrode pads 61 and the second electrode pads 62 are arranged on a head surface 64$s$ of the element insulation layers 64. In the present embodiment, the head surface 64$s$ of the element insulation layers 64 is the head surface of the uppermost one of the element insulation layers 64 in the z-direction.

A back surface 64$r$ of the element insulation layers 64 that is opposite the head surface 64$s$ of the element insulation layers 64 faces the substrate head surface 63$s$ of the substrate 63. In the present embodiment, the back surface 64$r$ of the element insulation layers 64 is in contact with the substrate head surface 63$s$ of the substrate 63. The back surface 64$r$ of the element insulation layers 64 is the back surface of the lowermost one of the element insulation layers 64 in the z-direction.

The transformer chip 60 includes a protective film 65, which is formed on the head surface 64$s$ of the element insulation layers 64, and a passivation film 66, which is formed on the protective film 65. The protective film 65 protects the element insulation layers 64 and is, for example, a silicon oxide film. The passivation film 66 is a head surface protective film of the transformer chip 60 and formed by, for example, a silicon nitride film. The passivation film 66 defines the chip main surface 60$s$ of the transformer chip 60.

The first electrode pads 61 and the second electrode pads 62 are covered by the protective film 65 and the passivation film 66. The protective film 65 and the passivation film 66 include open portions that expose the first electrode pads 61 and the second electrode pads 62. Wires W are connected to the exposed surfaces of the electrode pads 61 and 62.

As shown in FIGS. 3 to 6, the first coils 31A, 31B, 33A, and 33B are arranged in the element insulation layers 64. The first coil 38A is arranged in the element insulation layers 64. In other words, the looped conductive portions 39A to 39D are arranged in the element insulation layers 64. In the same manner, the second coil 38B is arranged in the element insulation layers 64. Thus, the second coils 32A, 32B, 34A, and 34B are arranged in the element insulation layers 64.

As shown in FIGS. 3, 5 and 6, the first coils 31A, 31B, 33A, and 33B are located at the same position in the z-direction. In other words, the first coils 31A, 31B, 33A, and 33B are arranged in the same one of the element insulation layers 64. In the present embodiment, the first coils 31A, 31B, 33A, and 33B are arranged in the element insulation layer 64 that is the first one below the uppermost one of the element insulation layers 64. In other words, the first coils 31A, 31B, 33A, and 33B are embedded in the element insulation layers 64.

As shown in FIGS. 4, 5, and 6, the second coils 32A, 32B, 34A, and 34B are located at the same position in the z-direction. In other words, the first coil 38A is located in the same one of the element insulation layers 64. In further detail, the first opposing portion 39$p$, the second opposing portion 39$q$, and the connection portion 39$r$ of the first coil 38A are arranged in the same one of the element insulation layers 64. Thus, the second coils 32A and 34A are connected to each other in the same one of the element insulation layers 64. The second coils 32B and 34B are connected to each other in the same one of the element insulation layers 64. In the present embodiment, the second coils 32A, 32B, 34A, and 34B are arranged in the lowermost one of the element insulation layers 64. In other words, the second coils 32A, 32B, 34A, and 34B are embedded in the element insulation layers 64. The second coils 32A, 32B, 34A, and 34B are embedded in the same one of the element insulation layers 64.

As shown in FIG. 5, the first coil 31A and the second coil 32A of the first transformer 21A are separated from each other in the z-direction. One or more of the element insulation layers 64 are located between the first coil 31A and the second coil 32A in the z-direction. In the present embodiment, five element insulation layers 64 are located between the first coil 31A and the second coil 32A in the z-direction. In this manner, the first coil 31A and the second coil 32A are arranged in the element insulation layers 64. The first coil 31A is located closer to the head surface 64*s* than to the back surface 64*r* in the element insulation layers 64, and the second coil 32A is located closer to the back surface 64*r* than to the head surface 64*s* in the element insulation layers 64.

The first coil 31A extends through one element insulation layer 64 in the z-direction. More specifically, the first insulation film 64A and the second insulation film 64B of one element insulation layer 64 both include an open portion for formation of the first coil 31A. A conductive member formed from a material containing Cu is embedded in the first coil 31A. The second coil 32A is formed in the same manner as the first coil 31A.

The first coil 33A and the second coil 34A of the second transformer 22A are separated from each other in the z-direction. One or more of the element insulation layers 64 are located between the first coil 33A and the second coil 34A. In the present embodiment, five element insulation layers 64 are located between the first coil 33A and the second coil 34A in the z-direction. Thus, distance DA between the first coil 31A and the second coil 32A of the first transformer 21A in the z-direction is equal to distance DB between the first coil 33A and the second coil 34A of the second transformer 22A in the z-direction. The first coil 33A is located closer to the head surface 64*s* than to the back surface 64*r* in the element insulation layers 64, and the second coil 34A is located closer to the back surface 64*r* than to the head surface 64*s* in the element insulation layers 64. The first coil 33A and the second coil 34A are formed in the same manner as the first coil 31A.

As shown in FIG. 6, the first coil 31B and the second coil 32B of the first transformer 21B are separated from each other in the z-direction. One or more of the element insulation layers 64 are located between the first coil 31B and the second coil 32B. In the present embodiment, five element insulation layers 64 are located between the first coil 31B and the second coil 32B in the z-direction. More specifically, distance DC between the first coil 31B and the second coil 32B of the first transformer 21B in the z-direction is equal to distance DA between the first coil 31A and the second coil 32A of the first transformer 21A in the z-direction. The first coil 31B is located closer to the head surface 64*s* than to the back surface 64*r* in the element insulation layers 64, and the second coil 32B is located closer to the back surface 64*r* than to the head surface 64*s* in the element insulation layers 64. The first coil 31B and the second coil 32B are formed in the same manner as the first coil 31A.

Although not shown in the drawings, the first coil 33B and the second coil 34B of the second transformer 22B are separated from each other in the z-direction. One or more of the element insulation layers 64 are located between the first coil 33B and the second coil 34B. In the present embodiment, five element insulation layers 64 are located between the first coil 33B and the second coil 34B in the z-direction. More specifically, the distance between the first coil 33B and the second coil 34B of the second transformer 22B in the z-direction is equal to distance DC between the first coil 31B and the second coil 32B of the first transformer 21B in the z-direction. The first coil 33B is located closer to the head surface 64*s* than to the back surface 64*r* in the element insulation layers 64, and the second coil 34B is located closer to the back surface 64*r* than to the head surface 64*s* in the element insulation layers 64. The first coil 33B and the second coil 34B are formed in the same manner as the first coil 31A.

As shown in FIG. 5, thickness T2 of the insulation plate 100 is less than thickness T1 of the transformer chip 60. Thickness T2 may be defined as the distance between the main surface 100*s* and the back surface 100*r* of the insulation plate 100 in the z-direction. Thickness T1 may be defined as the distance of the chip main surface 60*s* and the chip back surface 60*r* of the transformer chip 60 in the z-direction.

Thickness T2 of the insulation plate 100 is greater than thickness T3 of the substrate 63. Thickness T3 may be defined as the distance between the substrate head surface 63*s* of the substrate 63 and the substrate back surface 63*r* in the z-direction.

Thickness T2 of the insulation plate 100 is greater than thickness T4 of the element insulation layers 64. Thickness T4 may be defined as the distance between the head surface 64*s* and the back surface 64*r* of the element insulation layers 64 in the z-direction. In one example, thickness T2 of the insulation plate 100 is approximately 50 μm, and thickness T4 of the element insulation layers 64 is approximately 20 μm.

In the present embodiment, distance DA between the first coil 31A and the second coil 32A is less than thickness T2 of the insulation plate 100. In other words, thickness T2 of the insulation plate 100 is greater than distance DA between the first coil 31A and the second coil 32A. Thus, distance DD between the second coil 32A and the primary-side die pad 70 is greater than distance DA between the first coil 31A and the second coil 32A. Distance DB between the first coil 33A and the second coil 34A is equal to distance DA. Thus, distance DE between the second coil 34A and the primary-side die pad 70 is greater that distance DA. The relationship of the first coil 31B, the second coil 32B, and the primary-side die pad 70 and the relationship of the first coil 33B, the second coil 34B, and the primary-side die pad 70 are both similar to the relationship of the first coil 31A, the second coil 32A, and the primary-side die pad 70.

In the present embodiment, the first coils 31A and 31B each correspond to a first head surface conductive portion and a first head surface coil, and the second coils 32A and 32B each correspond to a first back surface conductive portion and a first back surface coil. The first coils 33A and 33B each correspond to a second head surface conductive portion and a second head surface coil, and the second coils 34A and 34B each correspond to a second back surface conductive portion and a second back surface coil.

As shown in FIGS. 3 and 5, the first end 36 of the first coil 31A includes a part facing the first electrode pad 61A in the z-direction. The first end 36 of the first coil 31A is connected by a connecting line 67 to the first electrode pad 61A. The connecting line 67 is a via extending through an element insulation layer 64 in the z-direction and formed from, for example, a material containing one or more of Ti, TiN, Au, Ag, Cu, and Al. In the present embodiment, the connecting line 67 is formed from a material containing Al. The connecting line 67 overlaps both the first end 36 of the first coil 31A and the first electrode pad 61A as viewed in the z-direction, and extends in the z-direction to connect the first end 36 and the first electrode pad 61A.

As shown in FIG. 5, the first end 36 of the first coil 33A (refer to FIG. 3) is connected to the second electrode pad 62A by another connecting line 67 that differs from the connecting line 67 described above. The first end 36 of the first coil 33A and the second electrode pad 62A are connected by the connecting line 67 in the same manner as the first end 36 of the first coil 31A and the first electrode pad 61A. As shown in FIG. 6, the first end 36 of the first coil 31B and the first electrode pad 61B are connected by another connecting line 67 that differs from the connecting lines 67 described above. The first end 36 of the first coil 31B and the first electrode pad 61B are connected by the connecting line 67 in the same manner as the first end 36 of the first coil 31A and the first electrode pad 61A. Although not shown in the drawings, the first end 36 of the first coil 33B and the second electrode pad 62B are connected by a further connecting line 67 that differs from the connecting lines 67 described above. The first end 36 of the first coil 33B and the second electrode pad 62B are connected by the connecting line 67 in the same manner as the first end 36 of the first coil 31A and the first electrode pad 61A.

As shown in FIGS. 3 and 6, the second end 37 of the first coil 31A and the second end 37 of the first coil 31B are connected by a connecting line 68 to the first electrode pad 61C. The connecting line 68 is a via extending through an element insulation layer 64 in the z-direction and formed from, for example, a material containing one or more of Ti, TiN, Au, Ag, Cu, and Al. In the present embodiment, the connecting line 68 is formed from a material containing Al. The connecting line 68 overlaps the second end 37 of the first coil 31A, the second end 37 of the first coil 31B, and the first electrode pad 61C as viewed in the z-direction, and extends in the z-direction to connect the second ends 37 and the first electrode pad 61C.

Although not shown in the drawings, the second end 37 of the first coil 33A and the second end 37 of the first coil 33B are connected to the second electrode pad 62C by a connecting line 68 that differs from the connecting line 68 described above. The second end 37 of the first coil 33A and the second end 37 of the first coil 33B are connected to the second electrode pad 62C by the connecting line 68 in the same manner as the second end 37 of the first coil 31A and the second end 37 of the first coil 31B that are connected to the first electrode pad 61C by the connecting line 68.

Operation of Embodiment

Figure 7:
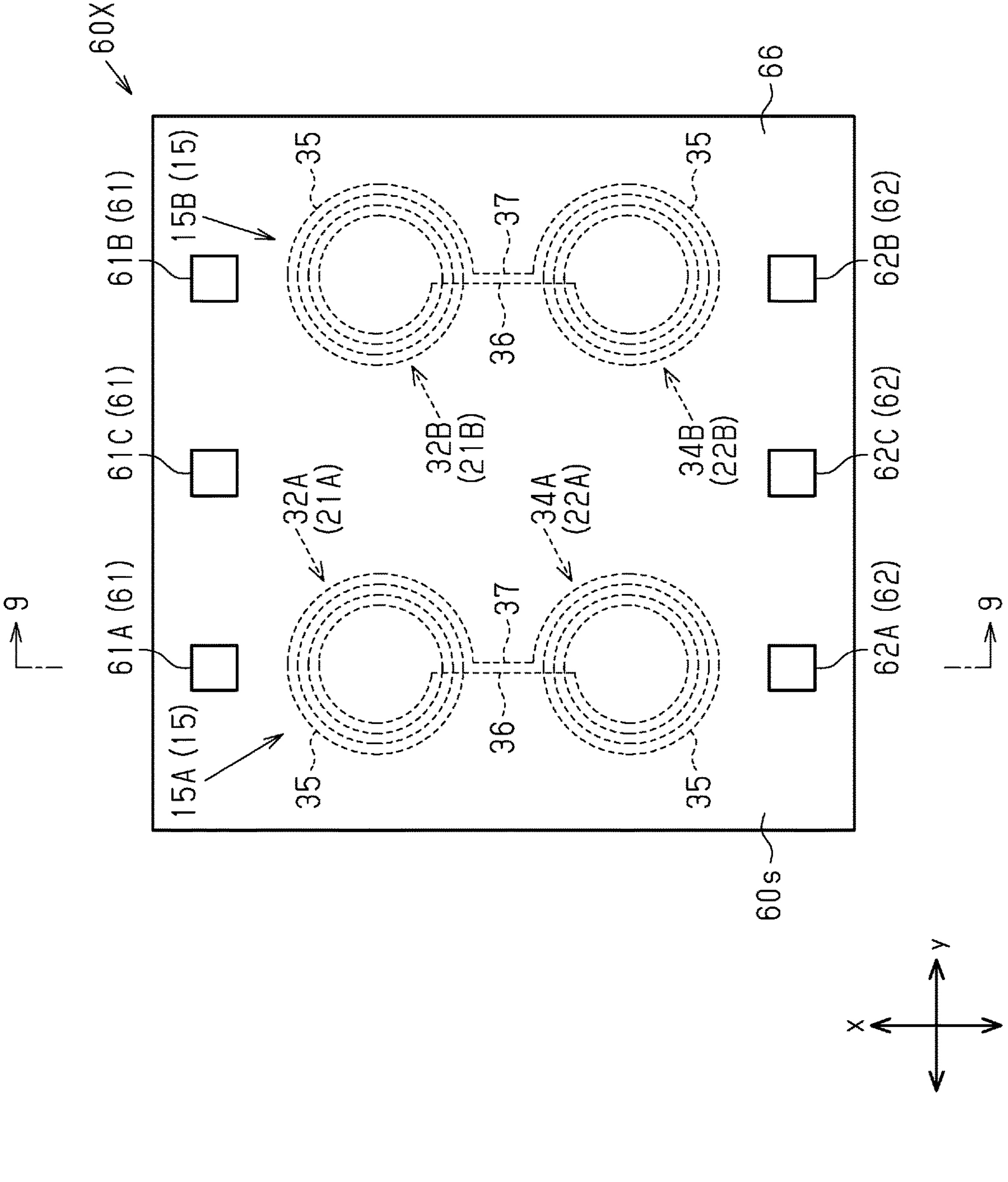
FIG. 7 is a plan view schematically illustrating the planar structure of a transformer chip in a comparative example.
Figure 8:
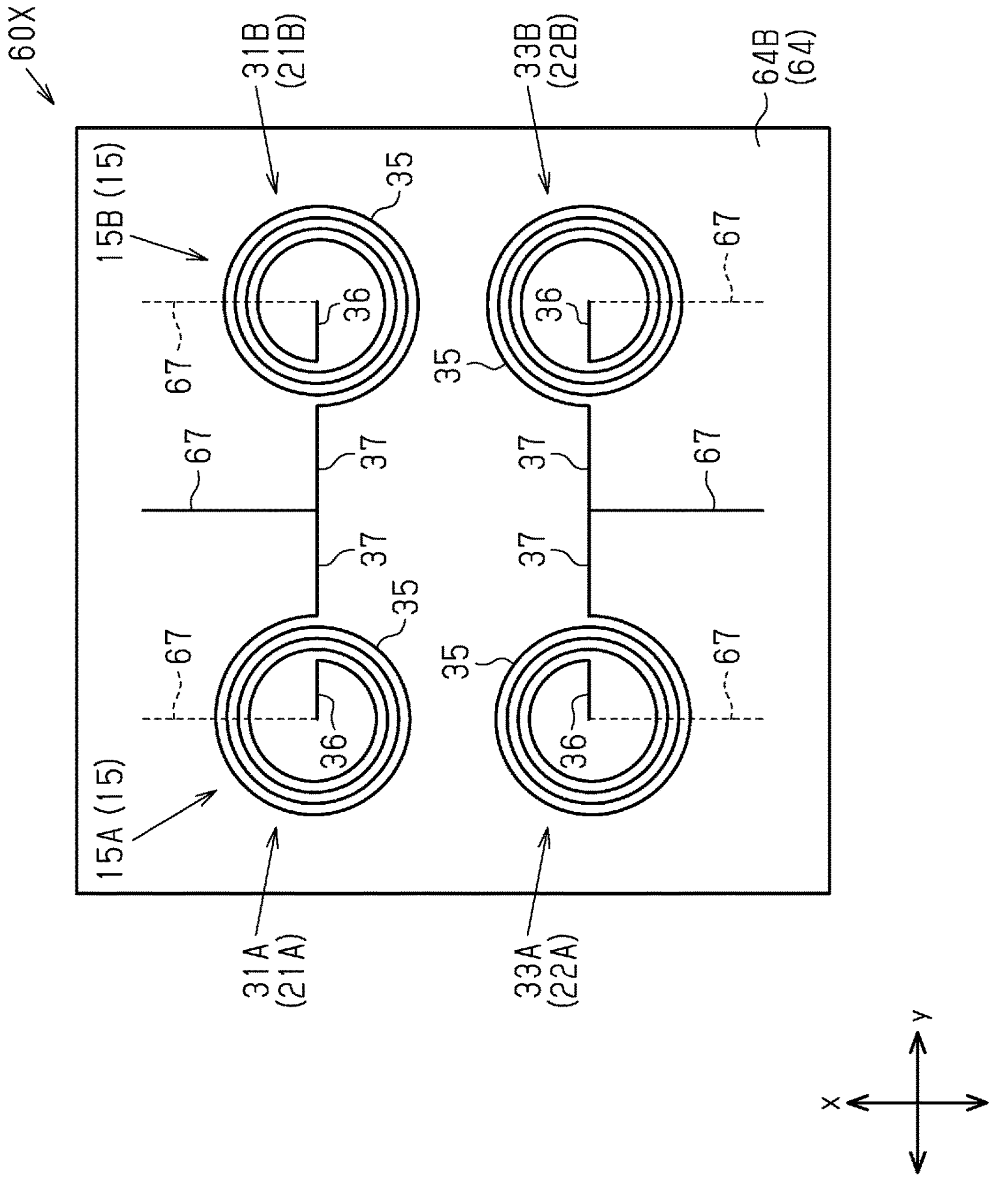
FIG. 8 is a cross-sectional view schematically illustrating the cross-sectional structure of the transformer chip in the comparative example taken along a plane orthogonal to the thickness direction of the transformer chip.
Figure 9:
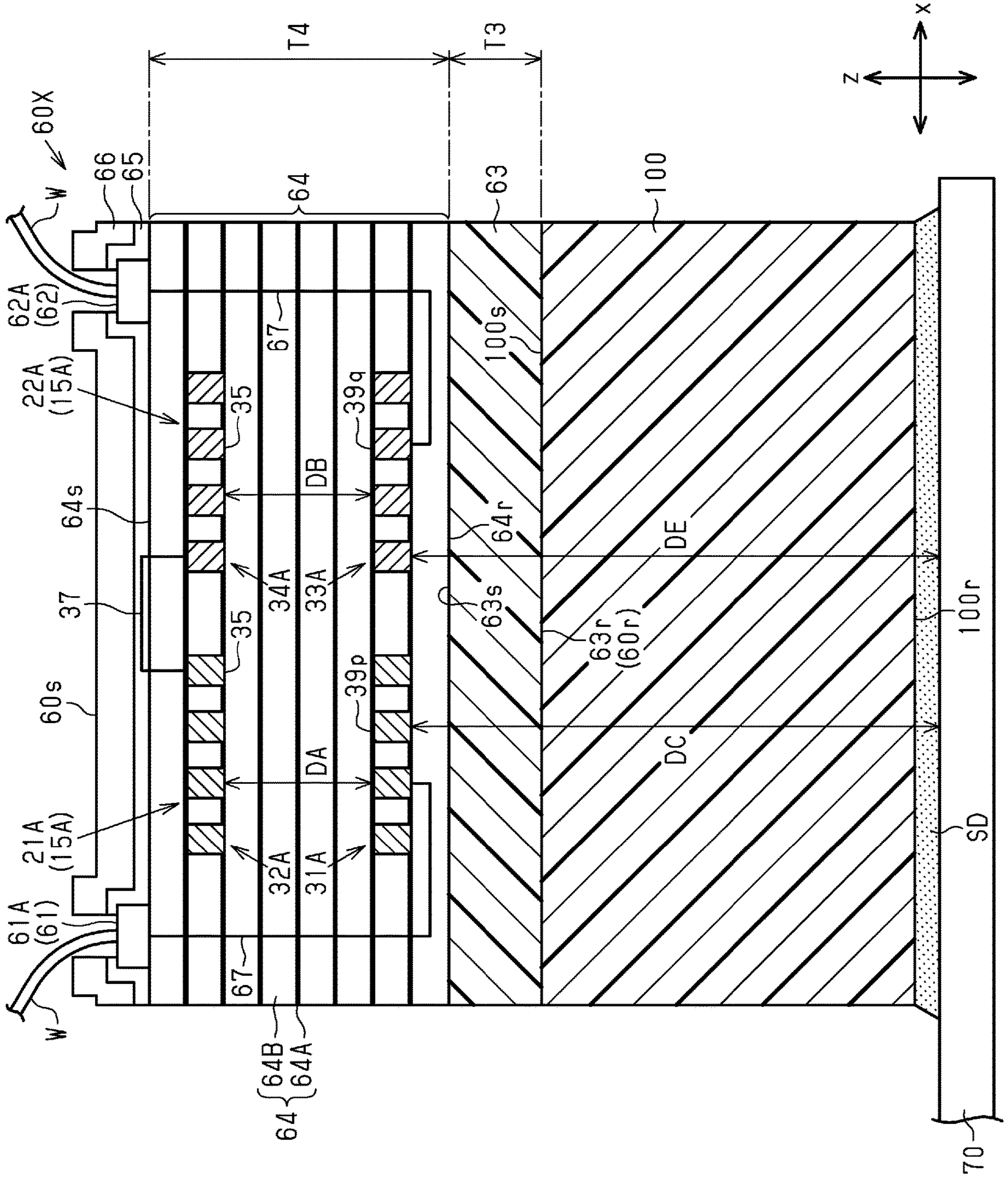
FIG. 9 is a cross-sectional view schematically illustrating the cross-sectional structure of the transformer chip taken along line 9-9 in FIG. 7.

The operation of the present embodiment will now be described. FIG. 7 is a plan view showing a transformer chip 60X of a comparative example. FIG. 8 is a cross-sectional view schematically illustrating the cross-sectional structure taken along an xy plane in the transformer chip 60X of the comparative example. Hatching lines are not shown in FIG. 8 to aid understanding. FIG. 9 is a cross-sectional view schematically illustrating the transformer chip 60X of the comparative example. In the description hereafter, same reference characters are given to those elements of the transformer chip 60X that are the same as the corresponding elements of the transformer chip 60 of the present embodiment.

As shown in FIG. 9, in the transformer chip 60X of the comparative example, the first coil 31A, which is electrically connected to the primary-side circuit 13 (refer to FIG. 1), is located closer to the back surface 64*r* of the element insulation layers 64 than to the second coil 32A. Thus, as shown in FIG. 7, the first electrode pad 61A of the transformer chip 60X is located closer to the first chip 40 (refer to FIG. 2) than to the first coil 31A in the x-direction. Although not shown in the drawings, the first coil 31B is located closer to the back surface 64*r* of the element insulation layers 64 than to the second coil 32B. Thus, the first electrode pad 61B of the transformer chip 60X is located closer to the first chip 40 than to the first coil 31B in the x-direction. In the illustrated example, the first electrode pad 61C of the transformer chip 60X is also located closer to the first chip 40 than to the first coils 31A and 31B.

Further, as shown in FIG. 9, in the transformer chip 60X of the comparative example, the first coil 33A, which is electrically connected to the secondary-side circuit 14 (refer to FIG. 1), is located closer to the back surface 64*r* of the element insulation layers 64 than to the second coil 34A. Thus, as shown in FIG. 7, the second electrode pad 62A of the transformer chip 60X is located closer to the second chip 50 (refer to FIG. 2) than to the first coil 33A in the x-direction. Although not shown in the drawings, the first coil 33B is located closer to the back surface 64*r* of the element insulation layers 64 than to the second coil 34B. Thus, the second electrode pad 62B of the transformer chip 60X is located closer to the second chip 50 than to the first coil 33B in the x-direction. In the illustrated example, the second electrode pad 62C of the transformer chip 60X is also located closer to the second chip 50 than to the first coils 33A and 33B.

In this manner, the first electrode pads 61A to 61C are located closer to the first chip 40 than to the first coils 31A and 31B, and the second electrode pads 62A to 62C are located closer to the second chip 50 than to the second coils 32A and 32B. Thus, the transformer chip 60X is enlarged in the x-direction.

In the present embodiment, as shown in FIG. 3, the first electrode pad 61A is located inward from the coil portion 35 of the first coil 31A, and the first electrode pad 61B is located inward from the coil portion 35 of the first coil 31B. As viewed in the y-direction, the first electrode pad 61C overlaps the coil portion 35 of the first coil 31A (31B) in the x-direction. Thus, the first electrode pads 61A to 61C are not located closer to the first chip 40 than to the first coil 31A (31B). Further, the second electrode pad 62A is located inward from the coil portion 35 of the first coil 33A, and the second electrode pad 62B is located inward from the coil portion 35 of the first coil 33B. As viewed in the y-direction, the second electrode pad 62C is located closer to the coil portion 35 of the first coil 33A (33B) in the x-direction. Thus, the second electrode pads 62A to 62C are not located closer to the second chip 50 than to the first coil 33A (33B). This structure allows the transformer chip 60 to be smaller in the x-direction than the transformer chip 60X of the comparative example.

Further, as shown in FIG. 7, in the transformer chip 60X of the comparative example, the second coil 32A (32B), which is not electrically connected to the primary-side circuit 13, and the second coil 34A (34B), which is not electrically connected to the secondary-side circuit 14, are electrically connected to each other.

As shown in FIGS. 8 and 9, in the transformer chip 60X of the comparative example, the first coil 31A (31B), which is electrically connected to the primary-side circuit 13, and the first coil 33A (33B), which is electrically connected to the secondary-side circuit 14, are located closer to the back surface 64*r* of the element insulation layers 64 than to the head surface 64*s*. This increases the length of both the connecting lines 67, which are connected to the first electrode pads 61A to 61C, and the connecting lines 68, which are connected to the second electrode pads 62A to 62C. In the illustrated example, the connecting lines 67 and 68 each extend from the uppermost one of the element insulation layers 64 to the lowermost one of the element insulation layers 64 in the z-direction. In addition, as shown in FIGS. 8 and 9, the connecting lines 67 and 68 have to be connected to the first ends, which are located inward from the coil portion 35 of the first coil 31A (first coil 33A), and thus have to extend across the coil portion 35 of the first coil 31A (first coil 33A), as viewed in the z-direction. Thus, at least one of the element insulation layers 64 is necessary between the first coil 31A (first coil 33A) and the substrate 63 for arrangement of the connecting lines 67 and 68. This decreases distance DA (DB) between the first coil 31A (33A) and the second coil 32A (34A) in the transformer chip 60X of the comparative example. The same applies to the relationship of the first coil 31B (33B) and the second coil 32B (34B) with the connecting lines 67. This increases the length of each of the connecting lines 67 and 68 thereby causing the process for forming the connecting lines 67 and 68 in the element insulation layers 64 to be more complicated.

In the present embodiment, as shown in FIG. 5, the first coil 31A (33A) is located farther away from the substrate 63 than from the second coil 32A (34A). That is, the first coil 31A (33A) is located closer to the first electrode pad 61A (second electrode pad 62A) than to the second coil 32A (34A) in the z-direction. In addition, as viewed in the z-direction, the first end 36 of the first coil 31A overlaps the first electrode pad 61A, and the first end 36 of the first coil 33A overlaps the second electrode pad 62A. This shortens the connecting lines 67 and 68. Further, each of the connecting lines 67 and 68 is a via extending through an element insulation layer 64. This simplifies the process for forming the connecting lines 67 and 68 in the element insulation layers 64. Additionally, there is no need for an element insulation layer 64 that is used for formation of the connecting lines 67 and 68 to be located between the substrate 63 and the coil that is close to the substrate 63 like in the transformer chip 60X of the comparative example. This will allow distance DA (DB) to be maintained between the first coil 31A (33A) and the second coil 32A (34A). The same applies to the first coil 31B (33B) and the second coil 32B (34B).

Advantages of First Embodiment

The present embodiment has the advantages described below.

(1-1) The signal transmission device 10 includes the first chip 40 that includes the primary-side circuit 13, the primary-side die pad 70 on which the first chip 40 is mounted, the transformer chip 60 serving as an insulation chip, the second chip 50 that includes the secondary-side circuit 14 configured to receive signals from the primary-side circuit 13 via the transformer chip 60, the secondary-side die pad 80 on which the second chip 50 is mounted, and the insulation plate 100 located between the primary-side die pad 70 and the transformer chip 60. The transformer chip 60 includes the element insulation layers 64, the first transformer 21A (21B) serving as a first insulation element, and the second transformer 22A (22B) serving as a second insulation element. The element insulation layers 64 include the head surface 64*s*, on which the first electrode pads 61 and the second electrode pads 62 are formed, and the back surface 64*r*, which is opposite the head surface 64*s*. The first transformer 21A (21B) and the second transformer 22A (22B) are arranged in the element insulation layers 64. The first transformer 21A (21B) includes the first coil 31A (31B), which serves as a first head surface conductive portion that is located closer to the head surface 64*s* than to the back surface 64*r* in the element insulation layers 64, and the second coil 32A (32B), which serves as a first back surface conductive portion that is located closer to the back surface 64*r* than to the head surface 64*s* in the element insulation layers 64. The first coil 31A (31B) is electrically connected to the first electrode pads 61. The second coil 32A (32B) faces the first coil 31A (31B) in the z-direction that is the thickness direction of the element insulation layers 64. The second transformer 22A (22B) includes the first coil 33A (33B), which serves as a second head surface conductive portion located closer to the head surface 64*s* than to the back surface 64*r* in the element insulation layers 64, and the second coil 34A (34B), which serves as a second back surface conductive portion located closer to the back surface 64*r* than to the head surface 64*s* in the element insulation layers 64. The first coil 33A (33B) is electrically connected to the second electrode pads 62. The second coil 34A (34B) faces the first coil 33A (33B) in the z-direction. The second coil 32A (32B) is electrically connected to the second coil 34A (34B). The first coil 31A (31B) is electrically connected to the primary-side circuit 13 via the first electrode pads 61. The first coil 33A (33B) is electrically connected to the secondary-side circuit 14 via the second electrode pads 62.

In this configuration, the first transformer 21A (21B) and the second transformer 22A (22B) are connected in series. This allows the signal transmission device 10 to have a higher dielectric breakdown voltage than, for example, a signal transmission device including a single transformer.

In addition, the distance between the first coil 31A (31B) and the first electrode pads 61 is shorter than when the first coil 31A (31B), which is connected to the first electrode pad 61A (61B), is located closer to the back surface 64*r* of the element insulation layers 64 than to the second coil 32A (32B). In the same manner, the distance between the first coil 33A (33B) and the second electrode pads 62 is shorter than when the first coil 33A (33B), which is connected to the second electrode pad 62A (62B), is located closer to the back surface 64*r* of the element insulation layers 64 than to the second coil 34A (34B). This reduces inductance resulting from the length of the conductive path between the first coil 31A (31B) and the first electrode pads 61 and the length of the conductive path between the first coil 33A (33B) and the second electrode pads 62. Thus, the noise included in the first signal and the second signal can be abated.

(1-2) The insulation plate 100 is mounted on the primary-side die pad 70. The transformer chip 60 is mounted on the insulation plate 100.

In this configuration, the insulation plate 100 is located between the transformer chip 60 and the primary-side die pad 70 in the z-direction. This increases the distance from the second coils 32A, 32B, 34A, and 34B of the transformer chip 60 to the primary-side die pad 70 in the z-direction. Thus, the dielectric breakdown voltage between the transformer chip 60 and the primary-side die pad 70 can be increased.

(1-3) Thickness T2 of the insulation plate 100 is greater than both distance DA between the first coil 31A and the second coil 32A in the z-direction and distance DB between the first coil 33A and the second coil 34A in the z-direction. Further, thickness T2 of the insulation plate 100 is greater than both distance DC between the first coil 31B and the second coil 32B in the z-direction and the distance between the first coil 33B and the second coil 34B in the z-direction.

In this configuration, distance DD (DE) between the second coil 32A (32B) and the primary-side die pad 70 in the z-direction is greater than distances DA to DC between the first coil 33B and the second coil 34B in the z-direction. This allows the dielectric breakdown voltage of the transformer chip 60 to be maintained.

(1-4) The insulation plate 100 is formed by an insulation substrate containing alumina or an insulation substrate containing glass.

In this structure, the insulation plate 100, which has thickness T2 as described above in advantage (1-2), can be formed more easily than when forming the insulation plate 100 with an insulation film.

(1-5) Distance DA between the first coil 31A and the second coil 32A in the z-direction is equal to distance DB between the first coil 33A and the second coil 34A in the z-direction. Further, distance DC between the first coil 31B and the second coil 32B in the z-direction is equal to the distance between the first coil 33B and the second coil 34B in the z-direction.

When the dielectric breakdown voltage of a first transformer differs from that of a second transformer, the total dielectric breakdown voltage of the series-connected first transformer and second transformer may become lower than the sum of the dielectric breakdown voltage of the first transformer and dielectric breakdown voltage of the second transformer.

In this configuration, the dielectric breakdown voltage of the first transformer 21A (21B) is equal to the dielectric breakdown voltage of the second transformer 22A (22B). Thus, the total dielectric breakdown voltage of the series-connected first transformer 21A (21B) and second transformer 22A (22B) is substantially equal to the sum of the dielectric breakdown voltage of the first transformer 21A (21B) and the dielectric breakdown voltage of the second transformer 22A (22B). This allows the dielectric breakdown voltage of the transformer chip 60 to be higher than when the dielectric breakdown voltage of the first transformer 21A (21B) differs from the dielectric breakdown voltage of the second transformer 22A (22B).

(1-6) The second coil 32A (32B) and the second coil 34A (34B) are located at the same position in the z-direction. The second coils 32A, 32B, 34A, and 34B include the first looped conductive portion 39A, which includes the first opposing portion 39*p*, the second opposing portion 39*q*, and the connection portion 39*r*, and the second looped conductive portion 39B, which is similar to the first looped conductive portion 39A and surrounds the first looped conductive portion 39A as viewed in the z-direction. The first opposing portion 39*p* faces the first coil 31A (31B) in the z-direction and forms the second coil 32A (32B). The second opposing portion 39*q* faces the first coil 33A (33B) in the z-direction and forms the second coil 34A (34B). The connection portion 39*r* connects the first opposing portion 39*p* and the second opposing portion 39*q*.

In this configuration, the second coil 32A (32B) and the second coil 34A (34B) are connected to each other and not separated from each other in the z-direction. Thus, the second coil 32A (32B) and the second coil 34A (34B), which are connected to each other, can be formed easily in the element insulation layers 64.

(1-7) The first coils 31A, 31B, 33A, and 33B are formed from a material containing copper. The second coils 32A, 32B, 34A, and 34B are formed from a material including aluminum.

In this configuration, the first coils 31A, 31B, 33A, and 33B, which is where a relatively large amount of current flows, is formed from a material containing copper. This allows current to flow smoothly through the first coils 31A, 31B, 33A, and 33B. The second coils 32A, 32B, 34A, and 34B are formed from a material containing aluminum. Thus, the second coils 32A, 32B, 34A, and 34B can be formed at a lower cost than the second coils 32A, 32B, 34A, and 34B.

(1-8) The first coil 31A (31B) and the first coil 33A (33B) are separated from each other in the x-direction, and the second coil 32A (32B) and the second coil 34A (34B) are separated from each other in the x-direction. The first coil 31A (33A) and the first coil 31B (33B) are separated from each other in the y-direction, and the second coil 32A (34A) and the second coil 32B (34B) are separated from each other in the y-direction. The first coil 31A (31B), which is electrically connected to the primary-side circuit 13, is located near the first chip 40 in the x-direction, and the first coil 33A (33B), which is electrically connected to the secondary-side circuit 14, is located near the second chip 50 in the x-direction.

In this configuration, the first chip 40, which includes the primary-side circuit 13, and the first coil 31A (31B) are easily connected by wires W. Further, the second chip 50, which includes the secondary-side circuit 14, and the first coil 33A (33B) are easily connected by wires W.

(1-9) As viewed in the z-direction, the first electrode pad 61A is located inward from the coil portion 35 of the first coil 31A, and the first electrode pad 61B is located inward from the coil portion 35 of the first coil 31B. As viewed in the y-direction, the first electrode pad 61C overlaps the first coil 31A (31B) in the x-direction. As viewed in the z-direction, the second electrode pad 62A is located inward from the coil portion 35 of the first coil 33A, and the second electrode pad 62B is located inward from the coil portion 35 of the first coil 33B. As viewed in the y-direction, the second electrode pad 62C overlaps the first coil 33A (33B) in the x-direction.

With this configuration, the transformer chip 60 can have a smaller size in the x-direction than when, for example, as viewed in the z-direction, the first electrode pads 61A to 61C are located closer to the first chip 40 than to the first coil 31A (31B) and the second electrode pads 62A to 62C are located closer to the second chip 50 than to the first coil 33A (33B).

(1-10) The second coils 32A, 32B, 34A, and 34B are arranged in the lowermost one of the element insulation layers 64.

This configuration allows for a significant increase in each of distance DA between the first coil 31A and the second coil 32A in the z-direction, distance DB between the first coil 33A and the second coil 34A in the z-direction, distance DC between the first coil 31B and the second coil 32B in the z-direction, and the distance between the first coil 33B and the second coil 34B in the z-direction. Thus, the dielectric breakdown voltage of the transformer chip 60 can be increased.

(1-11) The transformer chip 60, which serves as an insulated module, includes the element insulation layers 64, which includes the head surface 64*s* where the first electrode pads 61 and the second electrode pads 62 are formed and the back surface 64*r* that is opposite the head surface 64*s*, the first transformer 21A (21B), which serves as a first insulation element and is arranged in the element insulation layers 64, and the second transformer 22A (22B), which serves as a second insulation element and is arranged in the element insulation layers 64. The first transformer 21A (21B) includes the first coil 31A (31B), which serves as a first head surface conductive portion that is located closer to the head surface 64*s* than to the back surface 64*r* in the element insulation layers 64, and the second coil 32A (32B), which serves as a first back surface conductive portion that is located closer to the back surface 64*r* than to the head surface 64*s* in the element insulation layers 64. The first coil 31A (31B) is electrically connected to the first electrode pads 61. The second coil 32A (32B) faces the first coil 31A (31B) in the z-direction that is the thickness direction of the element insulation layers 64. The second transformer 22A (22B) includes the first coil 33A (33B), which serves as a second head surface conductive portion located closer to the head surface 64*s* than to the back surface 64*r* in the element insulation layers 64, and the second coil 34A (34B), which serves as a second back surface conductive portion located closer to the back surface 64*r* than to the head surface 64*s* in the element insulation layers 64. The first coil 33A (33B) is electrically connected to the second electrode pads 62. The second coil 34A (34B) faces the first coil 33A (33B) in the z-direction. The second coil 32A (32B) is electrically connected to the second coil 34A (34B). The first coil 31A (31B) is electrically connected to the primary-side circuit 13 via the first electrode pads 61. The first coil 33A (33B) is electrically connected to the secondary-side circuit 14 via the second electrode pads 62.

In this configuration, the first transformer 21A (21B) and the second transformer 22A (22B) are connected in series. This allows the transformer chip 60 to have a higher dielectric breakdown voltage, for example, a transformer chip including a single transformer.

In addition, the distance between the first coil 31A (31B) and the first electrode pads 61 is shorter than when the first coil 31A (31B), which is connected to the first electrode pad 61A (61B), is located closer to the back surface 64*r* of the element insulation layers 64 than to the second coil 32A (32B). In the same manner, the distance between the first coil 33A (33B) and the second electrode pads 62 is shorter than when the first coil 33A (33B), which is connected to the second electrode pad 62A (62B), is located closer to the back surface 64*r* of the element insulation layers 64 than to the second coil 34A (34B). This reduces inductance resulting from the length of the conductive path between the first coil 31A (31B) and the first electrode pads 61 and the length of the conductive path between the first coil 33A (33B) and the second electrode pads 62. Thus, the noise included in the first signal and the second signal can be abated.

Second Embodiment

A signal transmission device 10 in accordance with a second embodiment will now be described with reference to FIGS. 10 to 15. The signal transmission device 10 of the present embodiment differs from the signal transmission device 10 of the first embodiment in that the insulation structure formed by the transformer 15 is changed to an insulation structure formed by a capacitor 110. The description hereafter will focus on the differences from the first embodiment. Same reference characters are given to those components that are the same as the corresponding components of the first embodiment.

Figure 10:
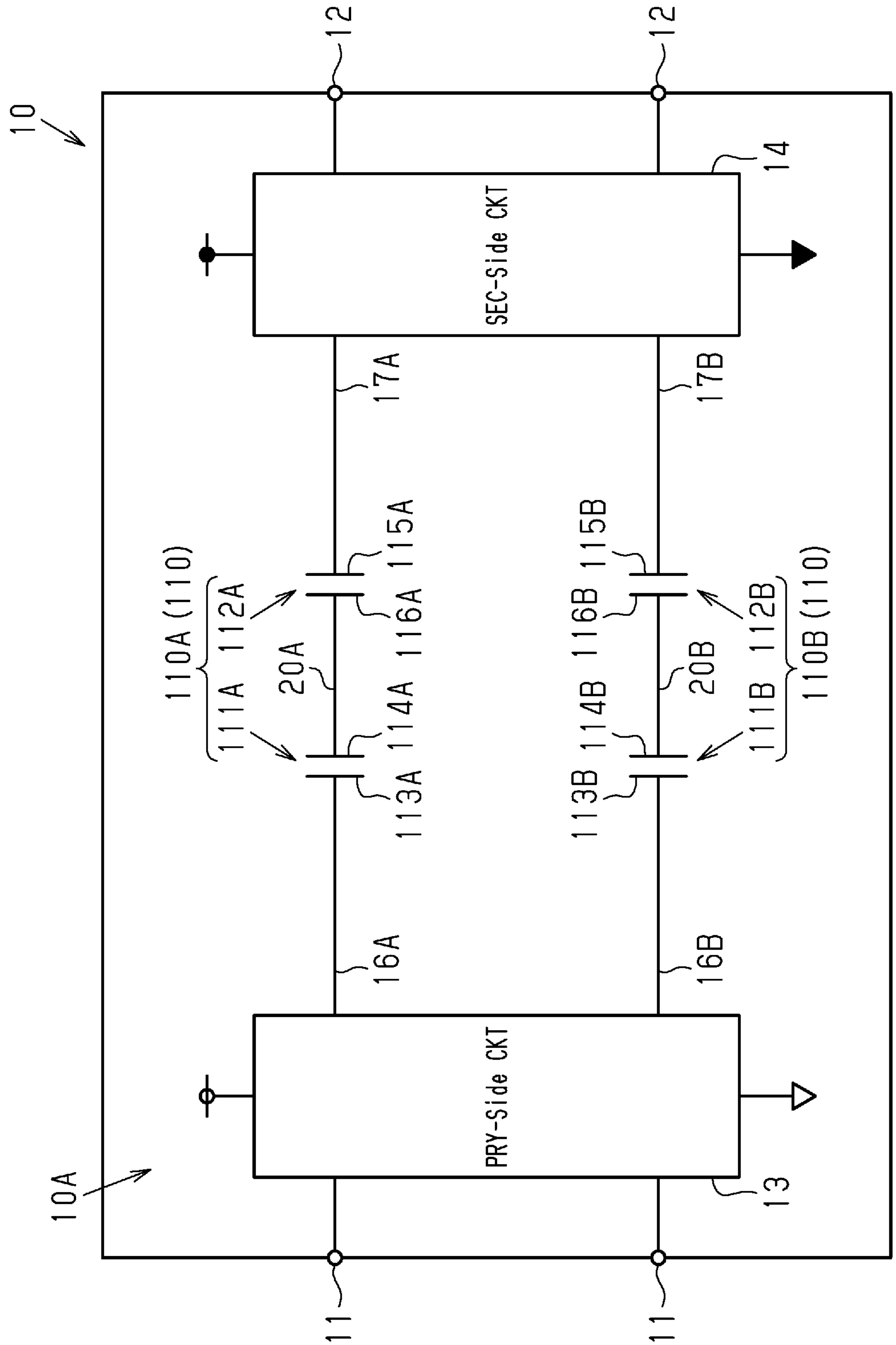
FIG. 10 is a circuit diagram schematically illustrating the circuit configuration of a signal transmission device in accordance with a second embodiment.

FIG. 10 is a schematic circuit diagram illustrating the signal transmission device 10 of the present embodiment. As shown in FIG. 10, the signal transmission circuit 10A of the signal transmission device 10 includes the capacitor 110 that electrically connects the primary-side circuit 13 and the secondary-side circuit 14. The capacitor 110 includes a capacitor 110A, which is connected to a signal line that transmits a first signal, and a capacitor 110B, which is connected to a signal line that transmits a second signal. The capacitors 110A and 110B are both located between the primary-side circuit 13 and the secondary-side circuit 14. In the present embodiment, the capacitor 110A corresponds to a first signal capacitor, and the capacitor 110B corresponds to a second signal capacitor.

The signal transmission circuit 10A includes a connecting signal line 20A, which serves as the signal line that transmits a first signal, and a connecting signal line 20B, which serves as the signal line that transmits a second signal. The connecting signal line 20A is located between the primary-side signal line 16A and the secondary-side signal line 17A. The connecting signal line 20B is located between the primary-side signal line 16B and the secondary-side signal line 17B. Thus, the signal line that transmits a first signal includes the primary-side signal line 16A, the secondary-side signal line 17A, and the connecting signal line 20A. The signal line that transmits a second signal includes the primary-side signal line 16B, the secondary-side signal line 17B, and the connecting signal line 20B.

The capacitor 110A includes a first capacitor 111A and a second capacitor 112A that are connected to each other in series by the connecting signal line 20A. The first capacitor 111A is electrically connected to the primary-side circuit 13, and the second capacitor 112A is electrically connected to the secondary-side circuit 14. In further detail, the first capacitor 111A includes a first electrode 113A and a second electrode 114A, and the second capacitor 112A includes a first electrode 115A and a second electrode 116A. The first electrode 113A of the first capacitor 111A is connected by the primary-side signal line 16A to the primary-side circuit 13, and the second electrode 114A is connected by the connecting signal line 20A to the second electrode 116A of the second capacitor 112A. The first electrode 115A of the second capacitor 112A is connected by the secondary-side signal line 17A to the secondary-side circuit 14. Thus, the primary-side circuit 13 and the secondary-side circuit 14 transmit a first signal through the first capacitor 111A and the second capacitor 112A, which are connected to each other in series.

The capacitor 110B includes a first capacitor 111B and a second capacitor 112B that are connected to each other in series by the connecting signal line 20B. The first capacitor 111B includes a first electrode 113B and a second electrode 114B, and the second capacitor 112B includes a first electrode 115B and a second electrode 116B. The configuration of the capacitor 110B and the configuration connecting the primary-side circuit 13 and the secondary-side circuit 14 are the same as the capacitor 110A and thus will not be described in detail. The primary-side circuit 13 and the secondary-side circuit 14 transmit a second signal through the first capacitor 111B and the second capacitor 112B, which are connected to each other in series. In the present embodiment, the first capacitors 111A and 111B each correspond to a first insulation element, and the second capacitors 112A and 112B each correspond to a second insulation element.

Figure 11:
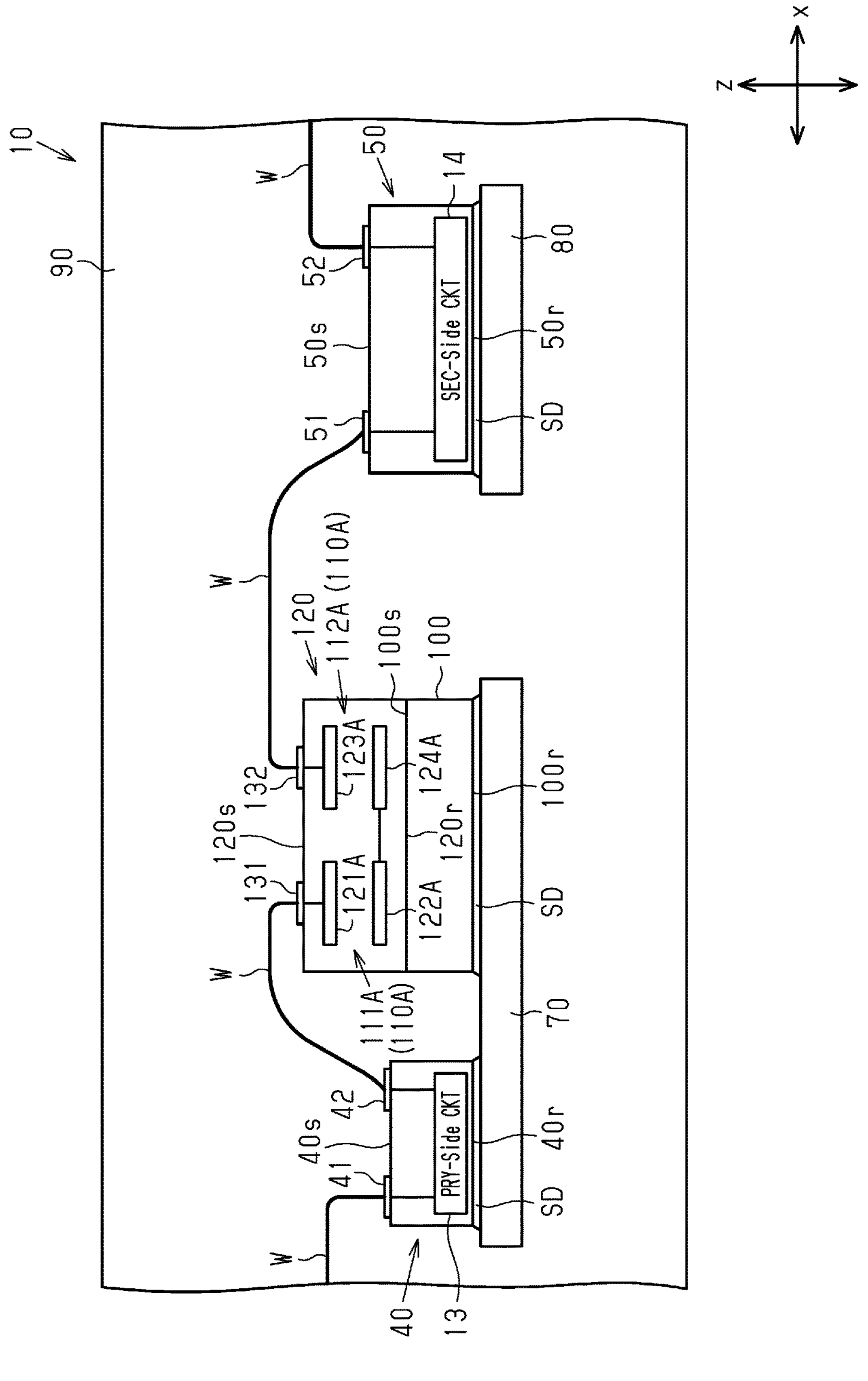
FIG. 11 is a cross-sectional view schematically illustrating the cross-sectional structure of the signal transmission device shown in FIG. 10.

FIG. 11 is a schematic cross-sectional view illustrating part of the signal transmission device 10 of the present embodiment. Hatching lines are not shown in FIG. 11 to aid understanding.

As shown in FIG. 11, the signal transmission device 10 includes a capacitor chip 120 in place of the transformer chip 60 (refer to FIG. 2) of the first embodiment. In the same manner as the transformer chip 60, the capacitor chip 120 is located between the first chip 40 and the second chip 50 in the x-direction. In the same manner as the transformer chip 60 of the first embodiment, in the present embodiment, the distance between the capacitor chip 120 and the second chip 50 in the x-direction is greater than the distance between the capacitor chip 120 and the first chip 40 in the x-direction.

The capacitor chip 120 is mounted on the primary-side die pad 70. In further detail, in the same manner as the first embodiment, the insulation plate 100 is mounted on the primary-side die pad 70. The capacitor chip 120 is mounted on the insulation plate 100. That is, the insulation plate 100 is located between the primary-side die pad 70 and the capacitor chip 120. In the present embodiment, the capacitor chip 120 corresponds to an insulation chip.

One example of the internal structure of the capacitor chip 120 will now be described with reference to FIGS. 11 to 15.

Figure 12:
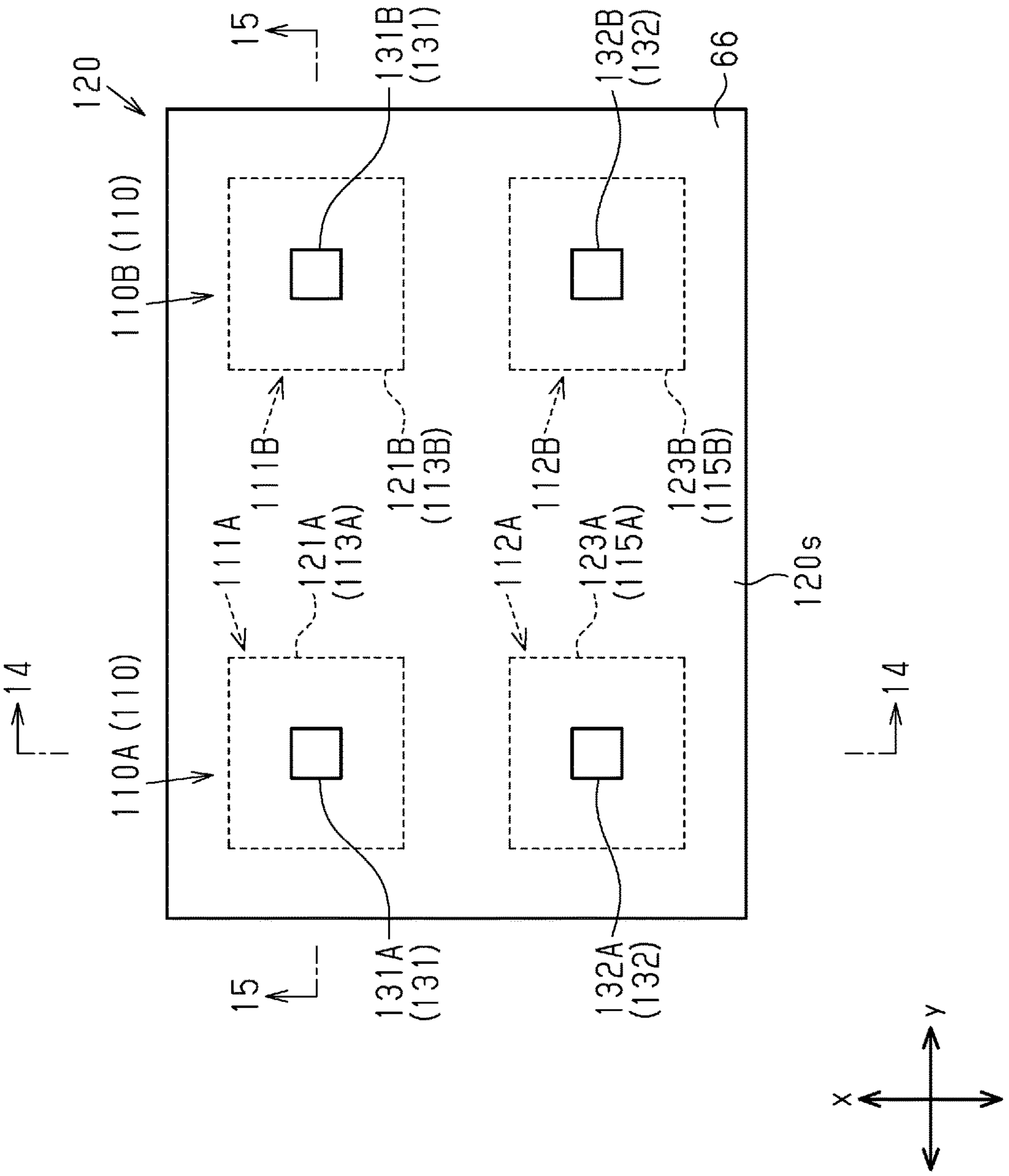
FIG. 12 is a plan view schematically illustrating the planar structure of a capacitor chip of the signal transmitter shown in FIG. 11.
Figure 13:
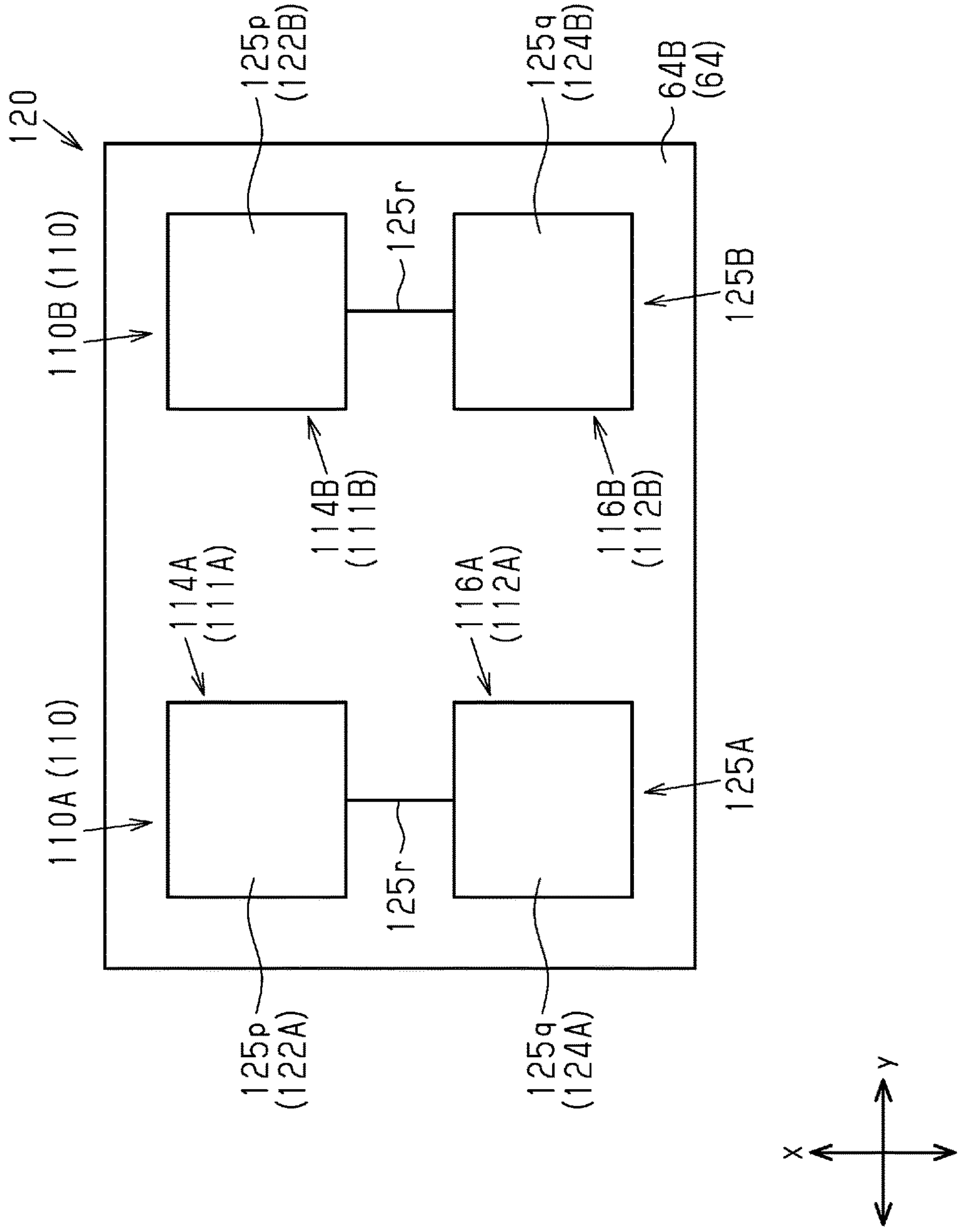
FIG. 13 is a cross-sectional view schematically illustrating the cross-sectional structure of the capacitor chip shown in FIG. 12 taken along a plane orthogonal to the thickness direction of the capacitor chip.
Figure 14:
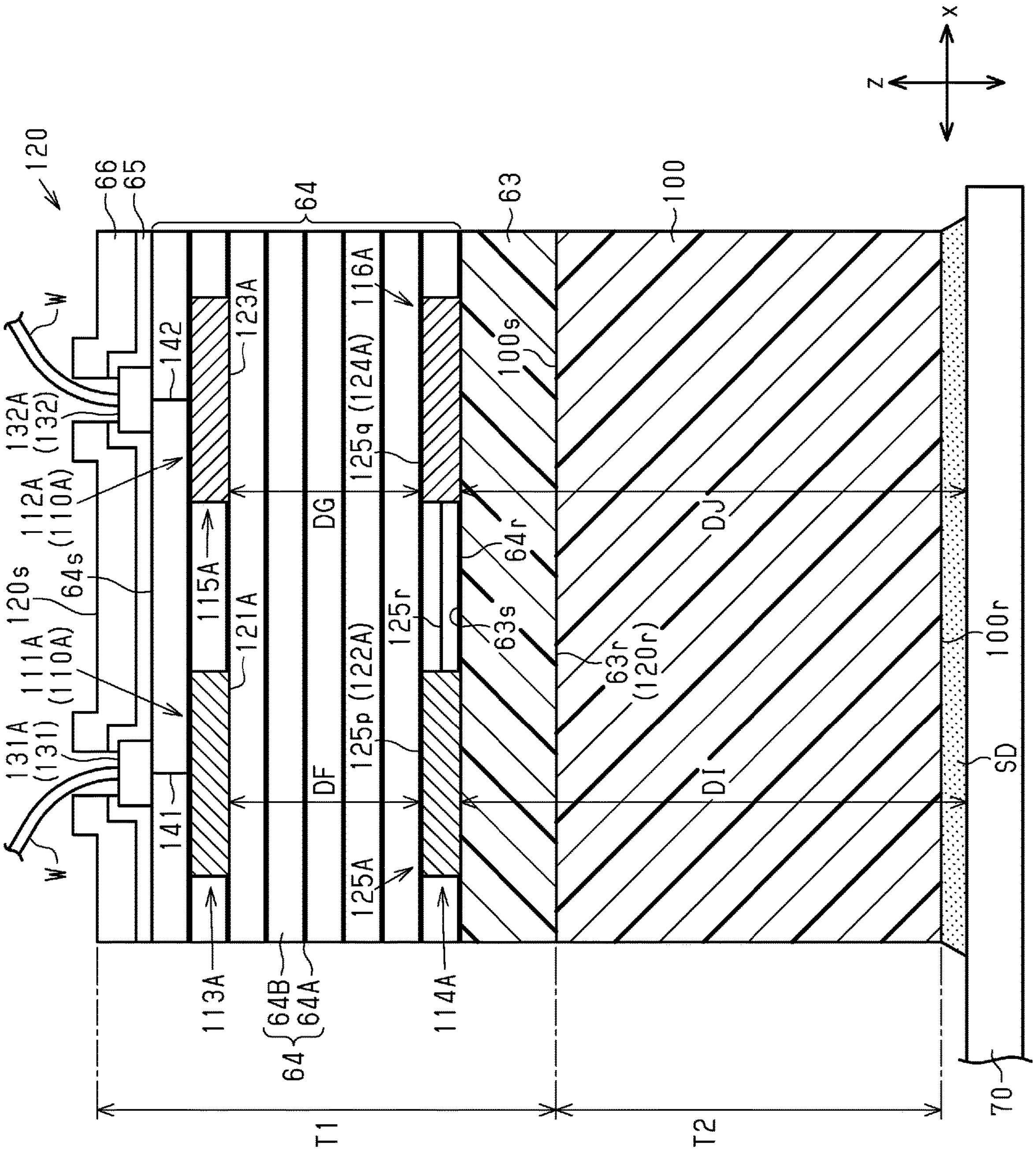
FIG. 14 is a cross-sectional view schematically illustrating the cross-sectional structure of the capacitor chip taken along line 14-14 in FIG. 12.
Figure 15:
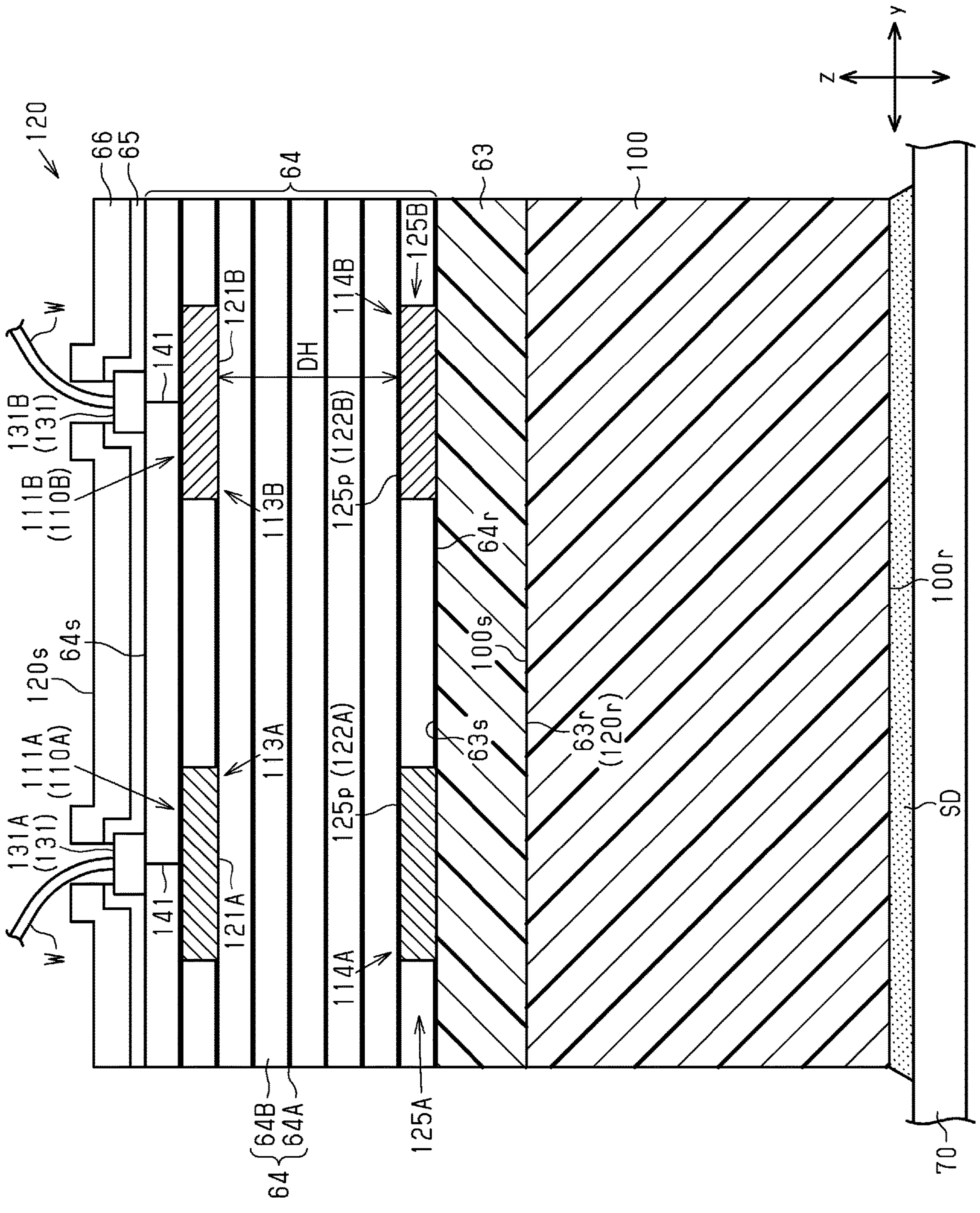
FIG. 15 is a cross-sectional view schematically illustrating the cross-sectional structure of the capacitor chip taken along line 15-15 in FIG. 12.

FIG. 12 is a plan view schematically illustrating the planar structure of the capacitor chip 120. FIG. 13 is a cross-sectional view schematically illustrating the cross-sectional structure taken along an xy plane in the capacitor chip 120. Hatching lines are not shown in FIG. 13 to aid understanding. FIGS. 14 and 15 illustrate the cross-sectional structure of the capacitor chip 120 in a state in which the capacitor chip 120 is mounted on the primary-side die pad 70.

As shown in FIG. 11, the capacitor chip 120 includes a chip main surface **120*s* and a chip back surface 120*r* at opposite sides in the z-direction. The chip main surface 120*s* faces the same direction as the chip main surface 40*s* of the first chip 40, and the chip back surface 120*r* faces the same direction as the chip back surface 40*r* of the first chip 40. In the description hereafter, the direction extending from the chip back surface 120*r* toward the chip main surface 120*s* of the capacitor chip 120 will be referred to as the upward direction, and the direction extending from the chip main surface 120*s* toward the chip back surface 120*r*** will be referred to as the downward direction.

As shown in FIGS. 12 to 15, the capacitor chip 120 includes the two capacitors 110A and 110B. More specifically, the capacitor chip 120 packages the two capacitors 110A and 110B into a single chip. Thus, the capacitor chip 120 is separate from the first chip 40 and the second chip 50 and dedicated to the two capacitors 110A and 110B.

With reference to FIGS. 12 and 13, as viewed in the z-direction, the capacitors 111A and 111B are located on the capacitor chip 120 close to the first chip 40 (refer to FIG. 11), and the capacitors 112A and 112B are located on the capacitor chip 120 close to the second chip 50 (refer to FIG. 11). The first capacitor 111A and the first capacitor 111B are located at the same position in the x-direction and separated from each other in the y-direction. The second capacitor 112A and the second capacitor 112B are located at the same position in the x-direction and separated from each other in the y-direction. The first capacitor 111A and the second capacitor 112A are located at the same position in the y-direction and separated from each other in the x-direction. The first capacitor 111B and the second capacitor 112B are located at the same position in the y-direction and separated from each other in the x-direction.

The first capacitor 111A includes a first electrode plate 121A and a second electrode plate 122A facing the first electrode plate 121A in the z-direction. The first electrode plate 121A forms the first electrode 113A of the first capacitor 111A, and the second electrode plate 122A forms the second electrode 114A of the first capacitor 111A.

The first capacitor 111B includes a first electrode plate 121B and a second electrode plate 122B facing the first electrode plate 121B in the z-direction. The first electrode plate 121B forms the first electrode 113B of the first capacitor 111B, and the second electrode plate 122B forms the second electrode 114B of the first capacitor 111B.

As shown in FIG. 12, the first electrode plate 121A and the first electrode plate 121B are located at the same position in the x-direction and separated from each other in the y-direction. Thus, as viewed in the z-direction, the first electrode plate 121A and the first electrode plate 121B are separated by a gap in the y-direction. As shown in FIG. 13, the second electrode plate 122A and the second electrode plate 122B are located at the same position in the x-direction and separated from each other in the y-direction. Thus, as viewed in the z-direction, the second electrode plate 122A and the second electrode plate 122B are separated by a gap in the y-direction.

As shown in FIGS. 12 and 13, the second capacitor 112A includes a first electrode plate 123A and a second electrode plate 124A facing the first electrode plate 123A in the z-direction. The first electrode plate 123A forms the first electrode 115A of the second capacitor 112A, and the second electrode plate 124A forms the second electrode 116A of the second capacitor 112A.

The second capacitor 112B includes a first electrode plate 123B and a second electrode plate 124B facing the first electrode plate 123B in the z-direction. The first electrode plate 123B forms the first electrode 115B of the second capacitor 112B, and the second electrode plate 124B forms the second electrode 116B of the second capacitor 112B.

As shown in FIG. 12, the first electrode plate 123A and the first electrode plate 123B are located at the same position in the x-direction and separated from each other in the y-direction. Thus, as viewed in the z-direction, the first electrode plate 123A and the first electrode plate 123B are separated by a gap in the y-direction. As shown in FIG. 13, the second electrode plate 124A and the second electrode plate 124B are located at the same position in the x-direction and separated from each other in the y-direction. Thus, as viewed in the z-direction, the second electrode plate 124A and the second electrode plate 124B are separated by a gap in the y-direction.

As shown in FIG. 12, the first electrode plate 121A and the first electrode plate 123A are located at the same position in the y-direction and separated from each other in the x-direction. Thus, as viewed in the z-direction, the first electrode plate 121A and the first electrode plate 123A are separated by a gap in the x-direction. The first electrode plate 121B and the first electrode plate 123B are located at the same position in the y-direction and separated from each other in the x-direction. Thus, as viewed in the z-direction, the first electrode plate 121B and the first electrode plate 123B are separated by a gap in the x-direction.

As shown in FIG. 13, the second electrode plate 122A and the second electrode plate 124A are located at the same position in the y-direction and separated from each other in the x-direction. Thus, as viewed in the z-direction, the second electrode plate 122A and the second electrode plate 124A are separated by a gap in the x-direction. The second electrode plate 122B and the second electrode plate 124B are located at the same position in the y-direction and separated from each other in the x-direction. Thus, as viewed in the z-direction, the second electrode plate 122B and the second electrode plate 124B are separated by a gap in the x-direction.

In the present embodiment, the electrode plates 121A, 121B, 122A, 122B, 123A, 123B, 124A, and 124B are each formed from a material containing one or more of Ti, TiN, Au, Ag, Cu, Al, and W. In the present embodiment, the electrode plates 121A, 121B, 122A, 122B, 123A, 123B, 124A, and 124B are formed from a material containing Cu. The electrode plates 121A, 121B, 122A, 122B, 123A, 123B, 124A, and 124B each have a flat form. As viewed in the z-direction, the electrode plates 121A, 121B, 122A, 122B, 123A, 123B, 124A, and 124B are identical in shape and are rectangular in the present embodiment. The electrode plates 121A, 121B, 122A, 122B, 123A, 123B, 124A, and 124B do not have to be rectangular and may have any shape as viewed in the z-direction.

As shown in FIGS. 14 and 15, in the same manner as the transformer chip 60 of the first embodiment, the capacitor chip 120 includes the substrate 63 and the element insulation layers 64. The substrate 63 and the element insulation layers 64 have the same configuration as the first embodiment. Further, in the same manner as the transformer chip 60 of the first embodiment, the capacitor chip 120 includes the protective film 65 and the passivation film 66. The protective film 65 and the passivation film 66 have the same configuration as the first embodiment.

As shown in FIGS. 12, 14, and 15, the first electrode plates 121A, 121B, 123A, and 123B are arranged in the element insulation layers 64. In the present embodiment, the first electrode plates 121A, 121B, 123A, and 123B are located at the same position in the z-direction. In other words, the first electrode plates 121A, 121B, 123A, and 123B are arranged in the same one of the element insulation layers 64. In the present embodiment, the first electrode plates 121A, 121B, 123A, and 123B are arranged in the element insulation layer 64 that is the first one below the uppermost one of the element insulation layers 64. In other words, the first electrode plates 121A, 121B, 123A, and 123B are embedded in the element insulation layers 64.

As shown in FIGS. 13 to 15, the second electrode plates 122A, 122B, 124A, and 124B are arranged in the element insulation layers 64. The second electrode plates 122A, 122B, 124A, and 124B are located at the same position in the z-direction. In other words, the second electrode plates 122A, 122B, 124A, and 124B are arranged in the same one of the element insulation layers 64. In the present embodiment, the second electrode plates 122A, 122B, 124A, and 124B are arranged in the lowermost one of the element insulation layers 64. In other words, the second electrode plates 122A, 122B, 124A, and 124B are embedded in the element insulation layers 64.

In this manner, in the present embodiment, distance DF between the first electrode plate 121A and the second electrode plate 122A in the z-direction is equal to distance DG between the first electrode plate 123A and the second electrode plate 124A in the z-direction. Distance DH between the first electrode plate 121B and the second electrode plate 122B in the z-direction is equal to the distance between the first electrode plate 123B and the second electrode plate 124B in the z-direction. Further, distances DF and DG are equal to distance DH.

In the present embodiment, thickness T2 of the insulation plate 100 is greater than each of distance DF between the first electrode plate 121A and the second electrode plate 122A in the z-direction, distance DG between the first electrode plate 123A and the second electrode plate 124A in the z-direction, distance DH between the first electrode plate 121B and the second electrode plate 122B in the z-direction, and the distance between the first electrode plate 123B and the second electrode plate 124B in the z-direction. Thus, distance DI between the second electrode plate 122A and the primary-side die pad 70 in the z-direction and distance DJ between the second electrode plate 124A and the primary-side die pad 70 in the z-direction are each greater than distances DF and DG. Further, the distance between the second electrode plate 122B and the primary-side die pad 70 in the z-direction and the distance between the second electrode plate 124B and the primary-side die pad 70 in the z-direction are both greater than distance DH and the distance between the first electrode plate 123B and the second electrode plate 124B in the z-direction. In the present embodiment, the second electrode plates 122A, 122B, 124A, and 124B are arranged in the same element insulation layer 64. Thus, distance DI is equal to distance DJ, and the distance between the second electrode plate 122B and the primary-side die pad 70 in the z-direction and the distance between the second electrode plate 124B and the primary-side die pad 70 in the z-direction are equal to distance DI (DJ).

In the present embodiment, the first electrode plates 121A and 121B each correspond to a first head surface conductive portion and a first head surface electrode plate, and the second electrode plates 122A and 122B each correspond to a first back surface conductive portion and a first back surface electrode plate. The first electrode plates 123A and 123B each correspond to a second head surface conductive portion and a second head surface electrode plate, and the second electrode plates 124A and 124B each correspond to a second back surface conductive portion and a second back surface electrode plate.

As shown in FIG. 12, the capacitor chip 120 includes a plurality of (two in the present embodiment) first electrode pads 131 and a plurality of (two in the present embodiment) second electrode pads 132. The electrode pads 131 and 132 are arranged on the capacitor chip 120 exposed to the outside from the chip main surface 120s of the capacitor chip 120. In the description hereafter, for the sake of simplicity, the two first electrode pads 131 may be referred to as the first electrode pads 131A and 131B, and the two second electrode pads 132 may be referred to as the second electrode pads 132A and 132B. In the present embodiment, the first electrode pads 131A and 131B each correspond to a first pad, and the second electrode pads 132A and 132B each correspond to a second pad.

The first electrode pads 131 are respectively connected to the first electrode plate 121A of the first capacitor 111A and the first electrode plate 121B of the first capacitor 111B.

In further detail, as shown in FIG. 14, the first electrode plate 121A of the first capacitor 111A is connected to the first electrode pad 131A by a connecting line 141. The connecting line 141 connected to the first electrode plate 121A is embedded in the element insulation layers 64. Thus, the first electrode plate 121A of the first capacitor 111A is electrically connected to the first electrode pad 131A in the element insulation layers 64.

As shown in FIG. 15, the first electrode plate 121B of the first capacitor 111B is connected to the first electrode pad 131B by a connecting line 141. The connecting line 141 connected to the first electrode plate 121B is embedded in the element insulation layers 64. Thus, the first electrode plate 121B of the first capacitor 111B is electrically connected to the first electrode pad 131B in the element insulation layers 64.

The first electrode pads 131A and 131B are connected by wires W (refer to FIG. 11) to the second electrode pads 42 of the first chip 40 (refer to FIG. 11). Thus, the first electrode plate 121A of the first capacitor 111A (first electrode 113A) and the first electrode plate 121B of the first capacitor 111B (first electrode 113B) are electrically connected to the primary-side circuit 13 (refer to FIG. 10).

As shown in FIG. 12, the first electrode pad 131A overlaps the first electrode plate 121A as viewed in the z-direction. The first electrode pads 131B overlaps the first electrode plate 121B as viewed in the z-direction. Thus, as shown in FIGS. 14 and 15, each connecting line 141 is a via extending through an element insulation layer 64 in the z-direction. In the present embodiment, each connecting line 141 is a via extending through a single element insulation layer 64. Each connecting line 141 is formed from a material containing, for example, one of more of Ti, TiN, Au, Ag, Cu, Al, and W. In the present embodiment, the connecting lines 141 are formed from a material containing Al.

As shown in FIG. 12, the second electrode pads 132 are respectively connected to the first electrode plate 123A of the second capacitor 112A and the first electrode plate 123B of the second capacitor 112B.

In further detail, as shown in FIG. 14, the first electrode plate 123A of the second capacitor 112A is electrically connected to the second electrode pad 132A by a connection line 142. The connection line 142 connected to the first electrode plate 123A is embedded in the element insulation layers 64. Thus, the first electrode plate 123A of the second capacitor 112A is electrically connected to the second electrode pad 132A in the element insulation layers 64.

Although not shown in the drawings, the first electrode plate 123B of the second capacitor 112B is connected to the second electrode pad 132B by a connection line 142 in the same manner as the first electrode plate 123A and the second electrode pad 132A. The connection line 142 connected to the first electrode plate 123B is embedded in the element insulation layers 64. Thus, the first electrode plate 123B of the second capacitor 112B is electrically connected to the second electrode pad 132B in the element insulation layers 64.

The second electrode pads 132A and 132B are connected by wires W to the first electrode pads 51 of the second chip 50 (refer to FIG. 11). This electrically connects the first electrode plate 123A of the second capacitor 112A (first electrode 115A) and the first electrode plate 123B of the second capacitor 112B (first electrode 115B) to the secondary-side circuit 14 (refer to FIG. 10).

As shown in FIG. 12, the second electrode pad 132A overlaps the first electrode plate 123A as viewed in the z-direction. The second electrode pad 132B overlaps the first electrode plate 123B as viewed in the z-direction. Thus, as shown in FIG. 14, each connection line 142 is a via extending through an element insulation layer 64 in the z-direction. In the present embodiment, each connection line 142 is a via extending through a single element insulation layer 64. Each connecting line 142 is formed from a material containing, for example, one of more of Ti, TiN, Au, Ag, Cu, Al, and W. In the present embodiment, the connecting lines 142 are formed from a material containing Al.

As shown in FIG. 13, the second electrode plate 122A of the first capacitor 111A and the second electrode plate 124A of the second capacitor 112A are integrated with each other into a first electrode body 125A. In further detail, the first electrode body 125A includes a first opposing portion 125*p*, a second opposing portion 125*q*, and a connection portion 125*r*. The first opposing portion 125*p*, the second opposing portion 125*q*, and the connection portion 125*r* are integrated. The first opposing portion 125*p* and the second opposing portion 125*q* are located at the same position in the y-direction and separated from each other in the x-direction.

The first opposing portion 125*p* faces the first electrode plate 121A in the z-direction and forms the second electrode plate 122A. The first opposing portion 125*p*, as viewed in the z-direction, has the same shape as the first electrode plate 121A, as viewed in the z-direction. Thus, in the present embodiment, the second electrode plate 122A, as viewed in the z-direction, has the same shape as the first electrode plate 121A, as viewed in the z-direction.

The second opposing portion 125*q* faces the first electrode plate 121B in the z-direction and forms the second electrode plate 122B. The second opposing portion 125*q* as viewed in the z-direction has the same shape as the first electrode plate 121B as viewed in the z-direction. Thus, in the present embodiment, the second electrode plate 122B as viewed in the z-direction has the same shape as the first electrode plate 121B as viewed in the z-direction.

The connection portion 125*r* connects the first opposing portion 125*p* and the second opposing portion 125*q*. In the present embodiment, the connection portion 125*r* extends in the x-direction. The connection portion 125*r* has a width (dimension of connection portion 125*r* in y-direction) that is less than the dimension of the first opposing portion 125*p* in the y-direction. Although the present embodiment includes one connection portion 125*r*, there is no limit to the number of connection portions 125*r*. There may be more than one connection portion 125*r*. In this case, the connection portions 125*r* will be separated from each other in the y-direction.

The second electrode plate 122B of the first capacitor 111B and the second electrode plate 124B of the second capacitor 112B are integrated with each other into a second electrode body 125. The second electrode body 125 has the same shape as the first electrode body 125A. Thus, the second electrode body 125 will not be described in detail. The present embodiment has the same advantages as the first embodiment.

Modified Examples

The embodiments described above exemplify, without any intention to limit, applicable forms of a signal transmission device. The signal transmission device in accordance with this disclosure may be modified from the embodiments described above. For example, the configuration in each of the above embodiments may be replaced, changed, or omitted in part or include an additional element. The modified examples described below may be combined as long as there is no technical contradiction. In the modified examples described hereafter, same reference characters are given to those components that are the same as the corresponding components of the above embodiments. Such components will not be described in detail.

In the first embodiment, the first electrode pads 61A and 61B of the transformer chip 60 may be located anywhere as viewed in the z-direction. For example, the first electrode pad 61A may be located outward from the coil portion 35 of the first coil 31A. In this case, as viewed in the y-direction, the first electrode pad 61A may overlap the coil portion 35 of the first coil 31A in the x-direction. Further, as viewed in the z-direction, the first electrode pad 61A may be located closer to the first chip 40 or the second chip 50 than to the coil portion 35 of the first coil 31A in the x-direction. That is, as viewed in the z-direction, the first electrode pad 61A may be located at the side of the first coil 31A opposite the first coil 33A in the x-direction. The first electrode pad 61B may be located outward from the coil portion 35 of the first coil 31B. In this case, as viewed in the y-direction, the first electrode pad 61B may overlap the coil portion 35 of the first coil 31B in the x-direction. Further, as viewed in the z-direction, the first electrode pad 61B may be located closer to the first chip 40 or the second chip 50 than to the coil portion 35 of the first coil 31B in the x-direction. Thus, as viewed in the z-direction, the first electrode pad 61B may be located at the side of the first coil 31B opposite the first coil 33B in the x-direction.

As viewed in the z-direction, for example, the first electrode pad 61A may overlap the coil portion 35 of the first coil 31A. As viewed in the z-direction, the first electrode pad 61B may overlap the coil portion 35 of the first coil 31B.

As viewed in the z-direction, for example, the first electrode pad 61A may overlap the center of the first coil 31A. Further, as viewed in the z-direction, the first electrode pad 61B may overlap the center of the first coil 31B.

In the first embodiment, the second electrode pads 62A and 62B of the transformer chip 60 may be located anywhere as viewed in the z-direction. For example, the second electrode pad 62A may be located outward from the coil portion 35 of the first coil 33A. In this case, as viewed in the y-direction, the second electrode pad 62B may overlap the coil portion 35 of the first coil 33A in the x-direction. Further, as viewed in the z-direction, the second electrode pad 62A may be located closer to the first chip 40 or the second chip 50 than to the coil portion 35 of the first coil 33A in the x-direction. Thus, as viewed in the z-direction, the second electrode pad 62A may be located at the side of the first coil 33A opposite the first coil 31A in the x-direction. The second electrode pad 62B may be located outward from the coil portion 35 of the first coil 33B. In this case, as viewed in the y-direction, the second electrode pad 62B may overlap the coil portion 35 of the first coil 33B in the x-direction. Further, as viewed in the z-direction, the second electrode pad 62B may be located closer to the first chip 40 or the second chip 50 than to the coil portion 35 of the first coil 33B in the x-direction. Thus, as viewed in the z-direction, the second electrode pad 62B may be located at the side of the first coil 33B opposite the first coil 31B in the x-direction.

As viewed in the z-direction, for example, the second electrode pad 62A may overlap the coil portion 35 of the first coil 33A. As viewed in the z-direction, the second electrode pad 62B may overlap the coil portion 35 of the first coil 33B.

As viewed in the z-direction, for example, the second electrode pad 62A may overlap the center of the first coil 33A. Further, as viewed in the z-direction, the second electrode pad 62B may overlap the center of the first coil 33B.

In the first embodiment, the second coils 32A, 32B, 34A, and 34B may be located anywhere in the z-direction. In one example, one or more of the element insulation layers 64 may be located between the second coils 32A, 32B, 34A, and 34B and the substrate 63 in the z-direction.

In the first embodiment, the second coils 32A, 32B, 34A, and 34B may have any shape as viewed in the z-direction. In one example, the second coil 32A and the second coil 32B may be formed separately. In this case, the second coil 32A and the second coil 32B may be annular or spiral as viewed in the z-direction. In the same manner, the second coil 34A and the second coil 34B may be formed separately. In this case, the second coil 34A and the second coil 34B may be annular or spiral as viewed in the z-direction.

Figure 16:
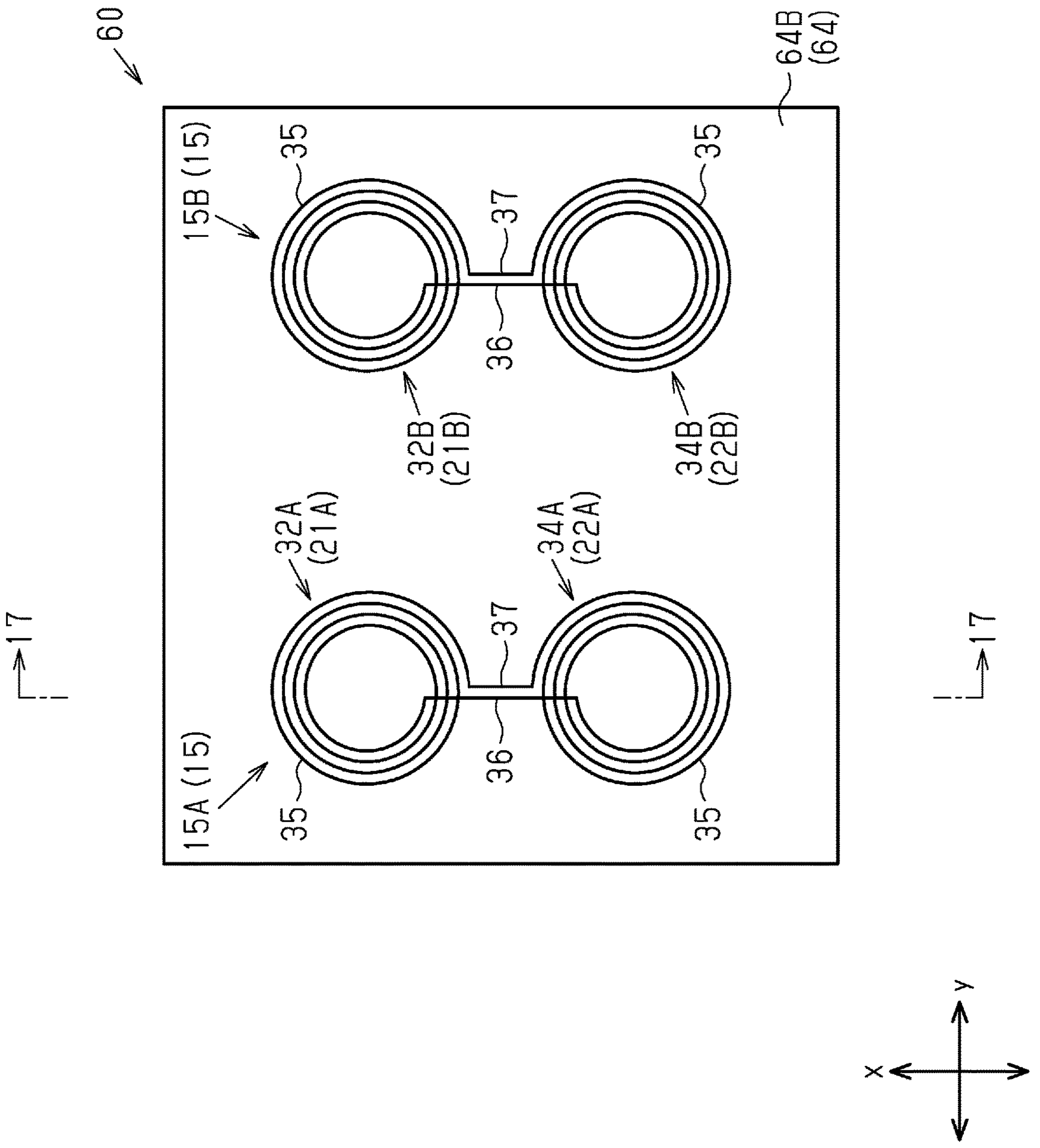
FIG. 16 is a cross-sectional view schematically illustrating the cross-sectional structure of a transformer chip in a comparative example taken along a plane orthogonal to the thickness direction of the transformer chip.
Figure 17:
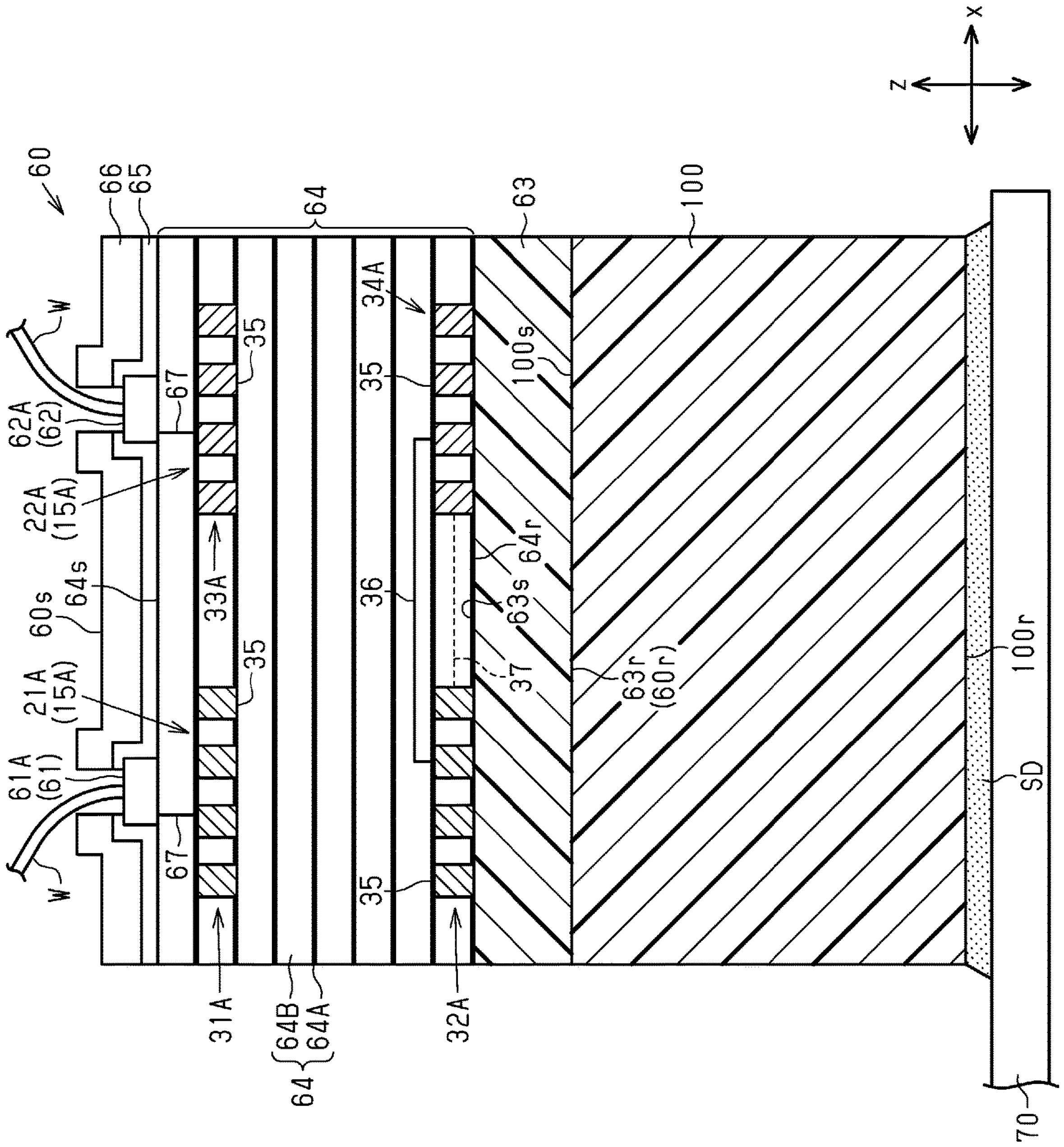
FIG. 17 is a cross-sectional view illustrating the cross-sectional structure of the transformer chip taken along line 17-17 in FIG. 16.

FIGS. 16 and 17 show the second coil 32A (32B) and the second coil 34A (34B) that are spiral. As shown in FIG. 16, the coil portion 35 of the second coil 32A (32B) and the coil portion 35 of the second coil 34A (34B) are connected at the first ends 36 and the second ends 37. As shown in FIG. 17, the second ends 37 of the second coils 32A and 34A are located at the same position as the coil portions 35 of the second coils 32A and 34A in the z-direction. The first ends 36 of the second coils 32A and 34A are located at a position that differs from that of the coil portions 35 of the second coils 32A and 34A in the z-direction. In the illustrated example, the first ends 36 of the second coils 32A and 34A are formed in the first one of the element insulation layers 64 above the element insulation layer 64 where the coil portion 35 of the second coils 32A and 34A are formed.

The first ends 36 of the second coils 32A and 34A may be located anywhere in the z-direction. In one example, when the element insulation layer 64 where the coil portions 35 of the second coils 32A and 34A are formed is not the lowermost one of the element insulation layers 64, the first ends 36 of the second coils 32A and 34A may be formed in an element insulation layer 64 that is closer to the substrate 63 than to the element insulation layer 64 where the coil portions 35 of the second coils 32A and 34A are formed.

In the first embodiment, the signal path that transmits a first signal from the primary-side circuit 13 to the secondary-side circuit 14 or the signal path that transmits a second signal from the primary-side circuit 13 to the secondary-side circuit 14 may be omitted. For example, FIGS. 18 and 19 show the configuration of the transformer chip 60 when omitting the signal path that transmits a second signal from the primary-side circuit 13 to the secondary-side circuit 14.

Figure 18:
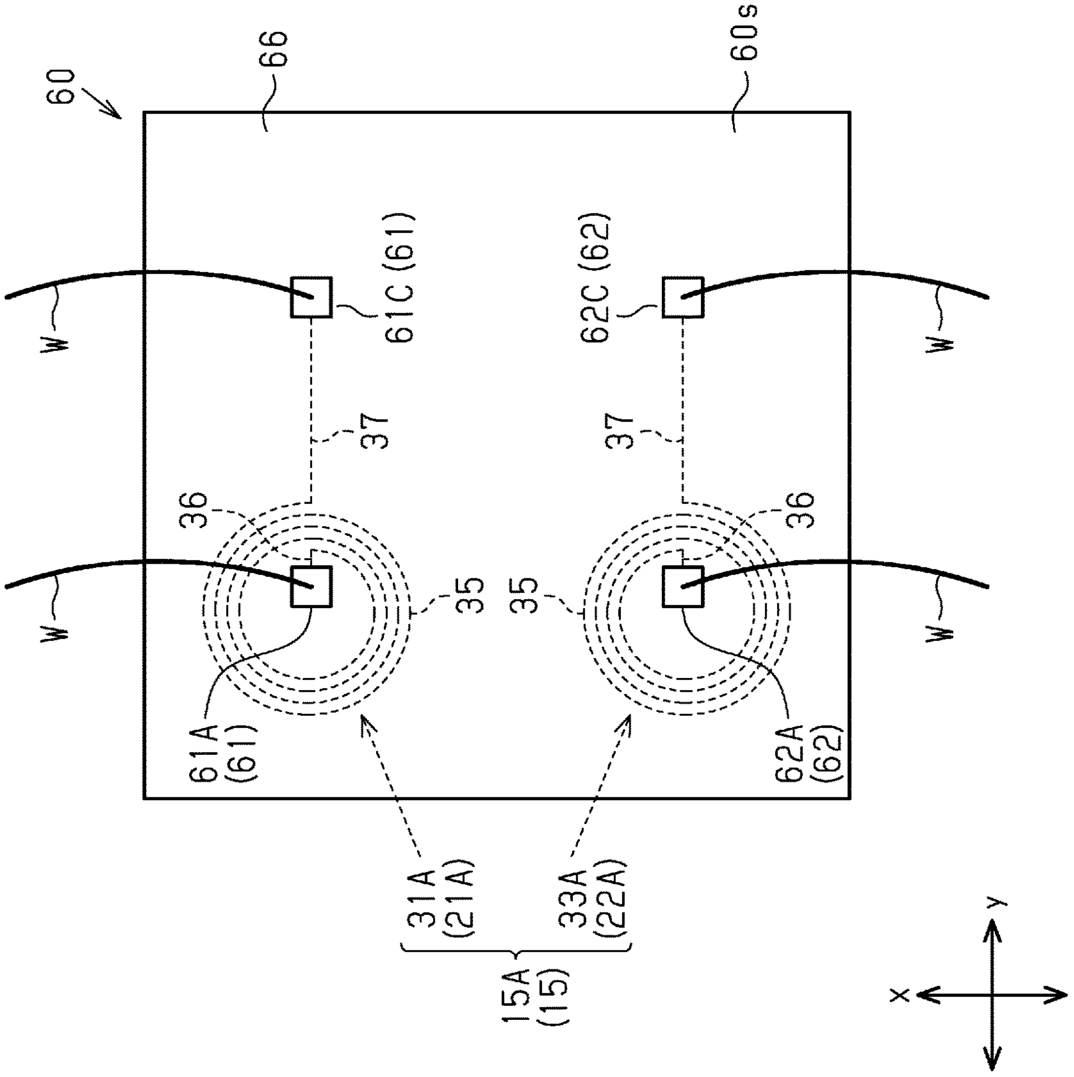
FIG. 18 is a plan view schematically illustrating the planar structure of a transformer chip in a comparative example.
Figure 19:
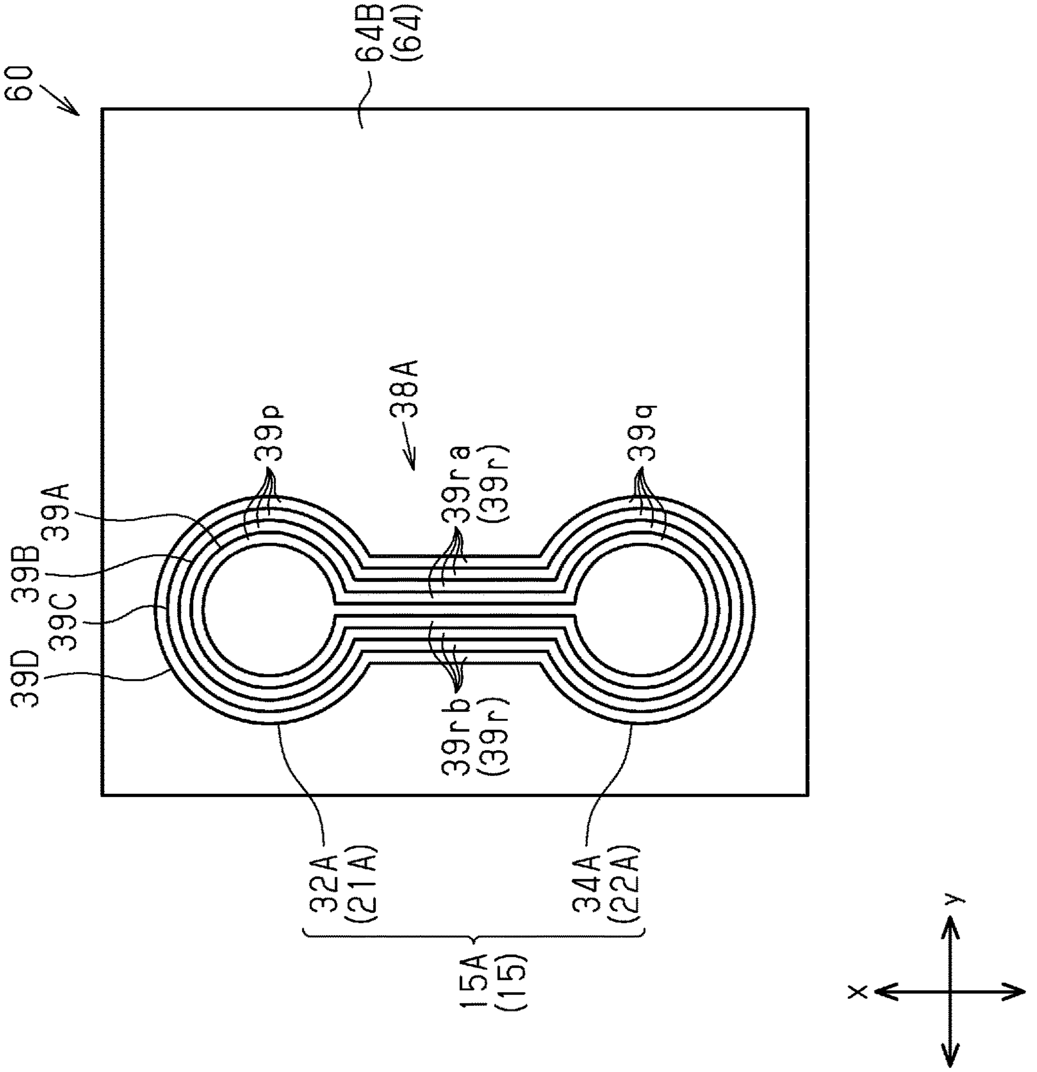
FIG. 19 is a cross-sectional view schematically illustrating the cross-sectional structure of the transformer chip shown in FIG. 18 taken along a plane orthogonal to the thickness direction of the transformer chip.

As shown in FIGS. 18 and 19, the transformer chip 60 packages the transformer 15A in a single chip. More specifically, the first coil 31A and the second coil 32A of the first transformer 21A and the first coil 33A and the second coil 34A of the second transformer 22A are embedded in the element insulation layers 64 of the transformer chip 60. As shown in FIG. 19, the second coil 32A and the second coil 34A form the first coil 38A.

As shown in FIG. 18, as viewed in the z-direction, the first coil 31A of the first transformer 21A and the first coil 33A of the second transformer 22A are located at the same position in the y-direction and separated from each other in the x-direction. The first coil 31A and the first coil 33A are located at the same position in the z-direction.

As shown in FIG. 18, the transformer chip 60 includes the two first electrode pads 61A and 61C and the two second electrode pads 62A and 62C. The first electrode pad 61A is located inward from the coil portion 35 of the first coil 31A, and the first electrode pad 61C is located outward from the coil portion 35 of the first coil 31A. The first end 36 of the first coil 31A is connected to the first electrode pad 61A, and the second end 37 of the first coil 31A is connected to the first electrode pad 61C. The second electrode pad 62A is located inward from the coil portion 35 of the first coil 33A, and the second electrode pad 62C is located outward from the coil portion 35 of the first coil 33A. The first end 36 of the first coil 33A is connected to the second electrode pad 62A, and the second end 37 of the first coil 33A is connected to the second electrode pad 62C. The second embodiment may be modified in the same manner.

In the first embodiment, the transformer chip 60 may include a dummy pattern. As viewed in the z-direction, the dummy pattern includes, for example, an annular first dummy pattern surrounding the first coil 38A and an annular second dummy pattern surrounding the second coil 38B. Further, as viewed in the z-direction, the dummy pattern includes an annular third dummy pattern surrounding the first coil 33A (33B).

In the first embodiment, at least one of the element insulation layers 64 may be located between the substrate 63 and the second coils 32A and 32B of the first transformer 21A (21B). Further, at least one of the element insulation layers 64 may be located between the substrate 63 and the second coils 34A and 34B of the second transformer 22A (22B).

In the second embodiment, the first electrode pads 131 of the capacitor chip 120 may be located anywhere as viewed in the z-direction. For example, the first electrode pad 131A does not have to overlap the first electrode plate 121A as viewed in the z-direction. The first electrode pad 131B does not have to overlap the first electrode plate 121B as viewed in the z-direction.

In the second embodiment, the second electrode pads 132 of the capacitor chip 120 may be located anywhere as viewed in the z-direction. For example, the second electrode pad 132A does not have to overlap the first electrode plate 123A as viewed in the z-direction. The second electrode pad 132B does not have to overlap the first electrode plate 123B as viewed in the z-direction.

In the second embodiment, the second electrode plates 122A, 122B, 124A, and 124B may be located anywhere in the z-direction. For example, one or more of the element insulation layers 64 may be located between the substrate 63 and the second electrode plates 122A, 122B, 124A, and 124B in the z-direction.

In the second embodiment, at least one of the element insulation layers 64 may be located between the substrate 63 and the second electrode plate 122A (122B) of the first capacitor 111A (111B). At least one of the element insulation layers 64 may be located between the substrate 63 and the second electrode plate 124A (124B) of the second capacitor 112A (112B).

In each embodiment, the transformer chip 60 (capacitor chip 120) may be mounted on the secondary-side die pad 80. In this case, the insulation plate 100 is mounted on the secondary-side die pad 80. The transformer chip 60 (capacitor chip 120) is mounted on the insulation plate 100, which is mounted on the secondary-side die pad 80.

In each embodiment, the transformer chip 60 (capacitor chip 120) may be mounted on an intermediate die pad that differs from the primary-side die pad 70 and the secondary-side die pad 80. The intermediate die pad is located between the primary-side die pad 70 and the secondary-side die pad 80 in the x-direction.

In each embodiment, the encapsulation resin 90 may be omitted from the signal transmission device 10.

In the above embodiments, any bonding material may be used between the insulation plate 100 and the primary-side die pad 70. For example, an insulative bonding material may be used in place of the conductive bonding material SD.

In each embodiment, the transformer chip 60 (capacitor chip 120) may include one or more resin layers as the element insulation layers 64. The resin layers may be formed from a material containing at least one of a polyimide resin, a phenol resin, and an epoxy resin.

The transformer chip 60 (capacitor chip 120) is applicable to a device other than the signal transmission device 10 of each embodiment.

The transformer chip 60 (capacitor chip 120) may be applied to, for example, a primary-side circuit module. More specifically, the primary-side circuit module includes the first chip 40, the transformer chip 60 (capacitor chip 120), and an encapsulation resin encapsulating the chips 40 and 60 (120). Further, the primary-side circuit module includes the primary-side die pad 70 on which the first chip 40 and the transformer chip 60 (capacitor chip 120) are mounted. The insulation plate 100 is mounted on the primary-side die pad 70. The transformer chip 60 (capacitor chip 120) is mounted on the insulation plate 100.

The transformer chip 60 (capacitor chip 120) may be applied to, for example, a secondary-side circuit module. More specifically, the secondary-side circuit module includes the second chip 50, the transformer chip 60 (capacitor chip 120), and an encapsulation resin encapsulating the chips 40 and 60 (120). Further, the secondary-side circuit module includes the secondary-side die pad 80 on which the second chip 50 and the transformer chip 60 (capacitor chip 120) are mounted. The insulation plate 100 is mounted on the secondary-side die pad 80. The transformer chip 60 (capacitor chip 120) is mounted on the insulation plate 100.

In each embodiment, the signal transmission device 10 may have any configuration.

For example, the signal transmission device 10 may include the primary-side circuit module and the second chip 50. In this case, the second chip 50 may be mounted on the secondary-side die pad 80, and the secondary-side die pad 80 and the second chip 50 may both be encapsulated by an encapsulation resin into a module.

The signal transmission device 10 may include, for example, the secondary-side circuit module and the first chip 40. In this case, the first chip 40 is mounted on the primary-side die pad 70, and the primary-side die pad 70 and the first chip 40 may both be encapsulated by an encapsulation resin into a module.

In each embodiment, the insulation plate 100 may be omitted from the signal transmission device 10. In this case, in the first embodiment, the transformer chip 60 is mounted on the primary-side die pad 70. More specifically, the transformer chip 60 is bonded by the conductive bonding material SD to the primary-side die pad 70. In the second embodiment, the capacitor chip 120 is mounted on the primary-side die pad 70. More specifically, the capacitor chip 120 is bonded by the conductive bonding material SD to the primary-side die pad 70. The transformer chip 60 may be mounted on the secondary-side die pad 80. The capacitor chip 120 may be mounted on the secondary-side die pad 80.

In each embodiment, the signal transmission device 10 may transmit a signal in any direction. For example, the signal transmission device 10 may be configured to transmit a signal through the transformer 15 from the secondary-side circuit 14 to the primary-side circuit 13. In further detail, when the secondary-side terminal 12 receives a signal (e.g., feedback signal) from a drive circuit that is electrically connected to the secondary-side circuit 14 through the secondary-side terminal 12, the secondary-side circuit 14 transmits the signal through the transformer 15 to the primary-side circuit 13. Then, the primary-side circuit 13 sends the signal to a controller that is electrically connected to the primary-side circuit 13 through the primary-side terminal 11. Further, the signal transmission device 10 may be configured to transmit a signal bidirectionally between the primary-side circuit 13 and the secondary-side circuit 14. In any case, the signal transmission device 10 may include the primary-side circuit 13 and the secondary-side circuit 14 that is configured to transmit a signal to or receive a signal from the primary-side circuit 13 through the transformer 15.

In this specification, the word "on" includes the meaning of "above" in addition to the meaning of "on" unless otherwise described in the context. Accordingly, the phrase of "A formed on B" means that A contacts B and is directly arranged on B, and may also mean, as a modified example, that A is arranged above B without contacting B. Thus, the word "on" will also allow for a structure in which another member is formed between A and B.

The z-direction referred to in this specification does not necessarily have to be the vertical direction and does not necessarily have to completely coincide with the vertical direction. Accordingly, in the structures of the present disclosure, up and down in the z-direction as referred to in this specification is not limited to up and down in the vertical direction. For example, the x-direction may be the vertical direction. Alternatively, the y-direction may be the vertical direction.

In this specification, "at least one of A and B" should be understood to mean "only A, only B, or both A and B."

As used herein, the term "annular" may refer to any structure that forms a loop, or a continuous shape without ends, and a generally looped structure with gaps, such as a C-shape. "Annular" shapes include, but are not limited to, circular shapes, elliptical shapes, and polygonal shapes with sharp or rounded corners.

Clauses

Technical concepts that can be understood from the above embodiment and the modified examples will now be described. The reference characters used to denote elements of the embodiments are shown in parenthesis for the corresponding elements of the clauses described below. The reference characters are given as examples to aid understanding and not intended to limit elements to the elements denoted by the reference characters.

[Clause 1]

A signal transmission device (10), including: a first chip (40) including a primary-side circuit (13);

a primary-side die pad (70) on which the first chip (40) is mounted;

an insulation chip (60/120);

a second chip (50) including a secondary-side circuit (14) configured to perform at least one of transmission of a signal to the primary-side circuit (13) through the insulation chip (60/120) and reception of a signal from the primary-side circuit (13) through the insulation chip (60/120);

a secondary-side die pad (80) on which the second chip (50) is mounted; and an insulation plate (100) located between the primary-side die pad (70) and the insulation chip (60/120) or between the secondary-side die pad (80) and the insulation chip (60/120), where:

the insulation chip (60/120) includes an element insulation layer (64) including a head surface (64*s*) on which a first pad (61/131) and a second pad (62/132) are formed, and a back surface (64*r*) at a side opposite the head surface (64*s*), and a first insulation element (21A, 21B/111A, 111B) and a second insulation element (22A, 22B/112A, 112B) arranged in the element insulation layer (64);

the first insulation element (21A, 21B/111A, 111B) includes a first head surface conductive portion (31A, 31B/121A, 121B) located in the element insulation layer (64) closer to the head surface (64*s*) than to the back surface (64*r*) and electrically connected to the first pad (61/131), and a first back surface conductive portion (32A, 32B/122A, 122B) located in the element insulation layer (64) closer to the back surface (64*r*) than to the head surface (64*s*), the first back surface conductive portion (32A, 32B/122A, 122B) facing the first head surface conductive portion (31A, 31B/121A, 121B) in a thickness direction (z-direction) of the element insulation layer (64); the second insulation element (22A, 22B/112A, 112B) includes a second head surface conductive portion (33A, 33B/123A, 123B) located in the element insulation layer (64) closer to the head surface (64*s*) than to the back surface (64*r*) and electrically connected to the second pad (62/132), and a second back surface conductive portion (34A, 34B/124A, 124B) located in the element insulation layer (64) closer to the back surface (64*r*) than to the head surface (64*s*) and facing the second head surface conductive portion (33A, 33B/123A, 123B) in the thickness direction (z-direction) of the element insulation layer (64);

the first back surface conductive portion (32A, 32B/122A, 122B) is electrically connected to the second back surface conductive portion (34A, 34B/124A, 124B), the first head surface conductive portion (31A, 31B/121A, 121B) and the primary-side circuit (13) are electrically connected by the first pad (61/131); and the second head surface conductive portion (33A, 33B/123A, 123B) and the secondary-side circuit (14) are electrically connected by the second pad (62/132).

[Clause 2]

The signal transmission device according to clause 1, where the insulation plate (100) is mounted on the primary-side die pad (70).

[Clause 3]

The signal transmission device according to clause 1, where the insulation plate (100) is mounted on the secondary-side die pad (80).

[Clause 4]

The signal transmission device according to clause 2 or 3, where the insulation plate (100) has a thickness (T2) that is greater than both a distance (DA, DC) between the first head surface conductive portion (31A, 31B/121A, 121B) and the first back surface conductive portion (32A, 32B/122A, 122B) in the thickness direction (z-direction) of the element insulation layer (64) and a distance (DC) between the second head surface conductive portion (33A, 33B/123A, 123B) and the second back surface conductive portion (34A, 34B/124A, 124B) in the thickness direction (z-direction) of the element insulation layer (64).

[Clause 5]

The signal transmission device according to any one of clauses 1 to 4, where the insulation plate (100) is formed by an insulation substrate containing alumina, formed by an insulation substrate containing glass, or formed from an insulation resin.

[Clause 6]

The signal transmission device according to any one of clauses 1 to 5, where the first back surface conductive portion (32A, 32B/122A, 122B) and the second back surface conductive portion (34A, 34B/124A, 124B) are located at the same position in the thickness direction (z-direction) of the element insulation layer (64).

[Clause 7]

The signal transmission device according to any one of clauses 1 to 6, where a distance (DA, DC) between the first head surface conductive portion (31A, 31B/121A, 121B) and the first back surface conductive portion (32A, 32B/122A, 122B) in the thickness direction (z-direction) of the element insulation layer (64) is equal to a distance (DC) between the second head surface conductive portion (33A, 33B/123A, 123B) and the second back surface conductive portion (34A, 34B/124A, 124B) in the thickness direction (z-direction) of the element insulation layer (64).

[Clause 8]

The signal transmission device according to any one of clauses 1 to 7, where:

the first head surface conductive portion includes a spiral or annular first head surface coil (31A, 31B);

the first back surface conductive portion includes a spiral or annular first back surface coil (32A, 32B);

the second head surface conductive portion includes a spiral or annular second head surface coil (33A, 33B); and the second back surface conductive portion includes a spiral or annular second back surface coil (34A, 34B).

[Clause 9]

The signal transmission device according to clause 8, where:

the first pad (61A, 61B) is located away from a center of the first head surface coil (31A, 31B) as viewed in the thickness direction (z-direction) of the element insulation layer (64); and the second pad (62A, 62B) is located away from a center of the second head surface coil (33A, 33B) as viewed in the thickness direction (z-direction) of the element insulation layer (64).

[Clause 10]

The signal transmission device according to clause 9, where:

the first pad (61A, 61B) is located at an inner side of the first head surface coil (31A, 31B) as viewed in the thickness direction (z-direction) of the element insulation layer (64); and the second pad (62A, 62B) is located at an inner side of the second head surface coil (33A, 33B) as viewed in the thickness direction (z-direction) of the element insulation layer (64).

[Clause 11]

The signal transmission device according to any one of clauses 8 to 10, where:

the first back surface coil (32A, 32B) and the second back surface coil (34A, 34B) are located at the same position in the thickness direction (z-direction) of the element insulation layer (64);

the insulation chip (60) includes a first looped conductive portion (39A) and a second looped conductive portion (39B) that are arranged in the element insulation layer (64);

the first looped conductive portion (39A) has a looped form including an annular first opposing portion (39*p*) and an annular second opposing portion (39*q*) that are open toward each other and a connection portion (39*r*) that connect open ends of the two opposing portions (39*p*, 39*q*);

the first opposing portion (39*p*) forms the first back surface coil (32A/32B) and faces the first head surface coil (31A/31B) in the thickness direction (z-direction) of the element insulation layer (64);

the second opposing portion (39*q*) forms the second back surface coil (34A/34B) and faces the second head surface coil (33A/33B) in the thickness direction (z-direction) of the element insulation layer (64); and the second looped conductive portion (39B) is similar to the first looped conductive portion (39A) and surrounds the first looped conductive portion (39A) as viewed in the thickness direction (z-direction) of the element insulation layer (64).

[Clause 12]

The signal transmission device according to any one of clauses 8 to 11, where:

the first head surface coil (31A, 31B) and the second head surface coil (33A, 33B) are both formed from a material containing copper; and the first back surface coil (32A, 32B) and the second back surface coil (34A, 34B) are both formed from a material containing aluminum.

[Clause 13]

The signal transmission device according to any one of clauses 8 to 12, where:

the signal transmission device (10) is configured to transmit a signal from the primary-side circuit (13) to the secondary-side circuit (14) through a transformer (15A, 15B) including the first insulation element (21A, 21B) and the second insulation element (22A, 22B);

the transformer includes a first signal transformer (15A) and a second signal transformer (15B);

the signal transmitted through the transformer (15A, 15B) includes a first signal and a second signal;

the first signal is transmitted through the first signal transformer (15A) from the primary-side circuit (13) to the secondary-side circuit (14); and the second signal is transmitted through the second signal transformer (15B) from the primary-side circuit (13) to the secondary-side circuit (14).

[Clause 14]

The signal transmission device according to clause 13, where:

the primary-side die pad (70) and the secondary-side die pad (80) are separated by a gap as viewed in the thickness direction (z-direction) of the element insulation layer (64);

the first chip (40), the second chip (50), and the insulation chip (60) are separated by a gap from one another in a first direction (x-direction) that is a direction in which the primary-side die pad (70) and the secondary-side die pad (80) are arranged;

the first head surface coil (31A, 31B) and the second head surface coil (33A, 33B) are separated by a gap in the first direction (x-direction);

the first back surface coil (32A, 32B) and the second back surface coil (34A, 34B) are separated by a gap in the first direction (x-direction);

the first head surface coil (31A) of the first signal transformer (15A) and the first head surface coil (31B) of the second signal transformer (15B) are separated by a gap in a second direction (y-direction) that is orthogonal to the first direction (x-direction) as viewed in the thickness direction (z-direction) of the element insulation layer (64);

the second head surface coil (33A) of the first signal transformer (15A) and the second head surface coil (33B) of the second signal transformer (15B) are separated by a gap in the second direction (y-direction);

the first back surface coil (32A) of the first signal transformer (15A) and the first back surface coil (32B) of the second signal transformer (15B) are separated by a gap in the second direction (y-direction); and the second back surface coil (34A) of the first signal transformer (15A) and the second back surface coil (34B) of the second signal transformer (15B) are separated by a gap in the second direction (y-direction).

[Clause 15]

The signal transmission device according to clause 14, where:

a third pad (61C) and a fourth pad (62C) are formed on the head surface (64*s*) of the element insulation layer (64);

the third pad (61C) is located between the first head surface coil (31A) of the first signal transformer (15A) and the first head surface coil (31B) of the second signal transformer (15B) as viewed in the thickness direction (z-direction) of the element insulation layer (64), and electrically connected to the first head surface coil (31A) of the first signal transformer (15A) and the first head surface coil (31B) of the second signal transformer (15B); and the fourth pad (62C) is located between the second head surface coil (33A) of the first signal transformer (15A) and the second head surface coil (33B) of the second signal transformer (15B) as viewed in the thickness direction (z-direction) of the element insulation layer (64), and electrically connected to the second head surface coil (33A) of the first signal transformer (15A) and the second head surface coil (33B) of the second signal transformer (15B).

[Clause 16]

The signal transmission device according to any one of clauses 1 to 7, where:

the first head surface conductive portion includes a first head surface electrode plate (121A, 121B) having a flat form;

the first back surface conductive portion includes a first back surface electrode plate (122A, 122B) having a flat form;

the second head surface conductive portion includes a second head surface electrode plate (123A, 123B) having a flat form; and the second back surface conductive portion includes a second back surface electrode plate (124A, 124B) having a flat form.

[Clause 17]

The signal transmission device according to clause 16, where:

the signal transmission device (10) is configured to transmit a signal from the primary-side circuit (13) to the secondary-side circuit (15) through a capacitor (110) including the first insulation element (110A) and the second insulation element (110B);

the capacitor (110) includes a first signal capacitor (110A) and a second signal capacitor (110B);

the signal transmitted through the capacitor (110) includes a first signal and a second signal;

the first signal is transmitted through the first signal capacitor (110A) from the primary-side circuit (13) to the secondary-side circuit (14); and the second signal is transmitted through the second signal capacitor (110B) from the primary-side circuit (13) to the secondary-side circuit (14).

[Clause 18]

The signal transmission device according to clause 17, where:

the primary-side die pad (70) and the secondary-side die pad (80) are separated by a gap as viewed in the thickness direction (z-direction) of the element insulation layer (64);

the first chip (40), the second chip (50), and the insulation chip (120) are separated by a gap from one another in a first direction (x-direction) that is a direction in which the primary-side die pad (70) and the secondary-side die pad (80) are arranged;

the first head surface electrode plate (121A, 121B) and the second head surface electrode plate (123A, 123B) are separated by a gap in the first direction (x-direction);

the first back surface electrode plate (122A, 122B) and the second back surface electrode plate (124A, 124B) are separated by a gap in the first direction;

the first head surface electrode plate (121A) of the first signal capacitor (110A) and the first head surface electrode plate (121B) of the second signal capacitor (110B) are separated by a gap in a second direction (y-direction) that is orthogonal to the first direction (x-direction) as viewed in the thickness direction (z-direction) of the element insulation layer (64);

the second head surface electrode plate (123A) of the first signal capacitor (110A) and the second head surface electrode plate (123B) of the second signal capacitor (110B) are separated by a gap in the second direction (y-direction);

the first back surface electrode plate (122A) of the first signal capacitor (110A) and the first back surface electrode plate (122B) of the second signal capacitor (110B) are separated by a gap in the second direction (y-direction); and the second back surface electrode plate (124A) of the first signal capacitor (110A) and the second back surface electrode plate (124B) of the second signal capacitor (110B) are separated by a gap in the second direction (y-direction).

[Clause 19]

The signal transmission device according to clause 18, where:

the first pad (131) overlaps the first head surface electrode plate (121A) of the first signal capacitor (110A) and the first head surface electrode plate (121B) of the second signal capacitor (110B) as viewed in the second direction (y-direction); and the second pad (132) overlaps the second head surface electrode plate (123A) of the first signal capacitor (110A) and the second head surface electrode plate (123B) of the second signal capacitor (110B) as viewed in the second direction (y-direction).

[Clause 20]

An insulated module, including:

an element insulation layer (64); and an insulation unit including a first insulation element (21A, 21B/111A, 111B) and a second insulation element (22A, 22B/112A, 112B) that are embedded in the element insulation layer (64), where:

the element insulation layer (64) includes a head surface (64*s*) on which a first pad (61/131), and a second pad (62/132) are formed and a back surface (64*r*) at a side opposite the head surface (64*s*);

the first insulation element (21A, 21B/111A, 111B) includes a first head surface conductive portion (31A, 31B/121A, 121B) located in the element insulation layer (64) closer to the head surface (64*s*) than to the back surface (64*r*) and electrically connected to the first pad (61/131), and a first back surface conductive portion (32A, 32B/122A, 122B) located in the element insulation layer (64) closer to the back surface (64*r*) than to the head surface (64*s*), the first back surface conductive portion (32A, 32B/122A, 122B) facing the first head surface conductive portion (31A, 31B/121A, 121B) in a thickness direction (z-direction) of the element insulation layer (64); the second insulation element (22A, 22B/112A, 112B) includes a second head surface conductive portion (33A, 33B/123A, 123B) located in the element insulation layer (64) closer to the head surface (64*s*) than to the back surface (64*r*) and electrically connected to the second pad (62/132), and a second back surface conductive portion (34A, 34B/134A, 134B) located in the element insulation layer (64) closer to the back surface (64*r*) than to the head surface (64*s*) and facing the second head surface conductive portion (33A, 33B/123A, 123B) in the thickness direction (z-direction) of the element insulation layer (64); and the first back surface conductive portion (32A, 32B/122A, 122B) is electrically connected to the second back surface conductive portion (34A, 34B/134A, 134B).

[Clause 21]

A signal transmission device (10), including:

a first chip (40) including a primary-side circuit (13);

a primary-side die pad (70) on which the first chip (40) is mounted;

an insulation chip (60/120);

a second chip (50) including a secondary-side circuit (14) configured to perform at least one of transmission of a signal to the primary-side circuit (13) through the insulation chip (60/120) and reception of a signal from the primary-side circuit (13) through the insulation chip (60/120); and a secondary-side die pad (80) on which the second chip (50) is mounted, where:

the insulation chip (60/120) is mounted on the primary-side die pad (70) or the secondary-side die pad (80);

the insulation chip (60/120) includes an element insulation layer (64) including a head surface (64*s*) on which a first pad (61/131) and a second pad (62/132) are formed, and a back surface (64*r*) at a side opposite the head surface (64*s*), and a first insulation element (21A, 21B/111A, 111B) and a second insulation element (22A, 22B/112A, 112B) arranged in the element insulation layer (64);

the first insulation element (21A, 21B/111A, 111B) includes a first head surface conductive portion (31A, 31B/121A, 121B) located in the element insulation layer (64) closer to the head surface (64*s*) than to the back surface (64*r*) and electrically connected to the first pad (61/131), and a first back surface conductive portion (32A, 32B/122A, 122B) located in the element insulation layer (64) closer to the back surface (64*r*) than to the head surface (64*s*), the first back surface conductive portion (32A, 32B/122A, 122B) facing the first head surface conductive portion (31A, 31B/121A, 121B) in a thickness direction (z-direction) of the element insulation layer (64);

the second insulation element (22A, 22B/112A, 112B) includes a second head surface conductive portion (33A, 33B/123A, 123B) located in the element insulation layer (64) closer to the head surface (64*s*) than to the back surface (64*r*) and electrically connected to the second pad (62/132), and a second back surface conductive portion (34A, 34B/124A, 124B) located in the element insulation layer (64) closer to the back surface (64*r*) than to the head surface (64*s*) and facing the second head surface conductive portion (33A, 33B/123A, 123B) in the thickness direction (z-direction) of the element insulation layer (64);

the first back surface conductive portion (32A, 32B/122A, 122B) is electrically connected to the second back surface conductive portion (34A, 34B/124A, 124B), the first head surface conductive portion (31A, 31B/121A, 121B) and the primary-side circuit (13) are electrically connected by the first pad (61/131); and the second head surface conductive portion (33A, 33B/123A, 123B) and the secondary-side circuit (14) are electrically connected by the second pad (62/132).

[Clause 22]

The signal transmission device according to clause 10, where:

the first pad (61A, 61B) is located at a side of the first head surface coil (31A, 31B) opposite the second head surface coil (33A, 33B); and the second pad (62A, 62B) is located at a side of the second head surface coil (33A, 33B) opposite the first head surface coil (31A, 31B).

[Clause 23]

The signal transmission device according to clause 10, where:

the first pad (61A, 61B) overlaps the first head surface coil (31A, 31B) as viewed in a direction (y-direction) that is orthogonal to both the thickness direction (z-direction) of the element insulation layer (64) and a direction in which the first head surface coil (31A, 31B) and the second head surface coil (33A, 33B) are arranged (x-direction); and the second pad (62A, 62B) overlaps the second head surface coil (33A, 33B) in the direction (y-direction) that is orthogonal to both the thickness direction (z-direction) of the element insulation layer (64) and the direction in which the first head surface coil (31A, 31B) and the second head surface coil (33A, 33B) are arranged (x-direction).

The invention claimed is:

1. A signal transmission device, comprising:

a first chip including a primary-side circuit;

a primary-side die pad on which the first chip is mounted;

an insulation chip;

a second chip including a secondary-side circuit configured to perform at least one of transmission of a signal to the primary-side circuit through the insulation chip and reception of a signal from the primary-side circuit through the insulation chip;

a secondary-side die pad on which the second chip is mounted; and an insulation plate located between the primary-side die pad and the insulation chip or between the secondary-side die pad and the insulation chip, wherein:

the insulation chip includes an element insulation layer including a head surface on which a first pad and a second pad are formed, and a back surface at a side opposite the head surface, and a first insulation element and a second insulation element arranged in the element insulation layer, wherein:

the first insulation element includes a first head surface conductive portion located in the element insulation layer closer to the head surface than to the back surface and electrically connected to the first pad, and a first back surface conductive portion located in the element insulation layer closer to the back surface than to the head surface, the first back surface conductive portion facing the first head surface conductive portion in a thickness direction of the element insulation layer;

the second insulation element includes a second head surface conductive portion located in the element insulation layer closer to the head surface than to the back surface and electrically connected to the second pad, and a second back surface conductive portion located in the element insulation layer closer to the back surface than to the head surface and facing the second head surface conductive portion in the thickness direction of the element insulation layer;

the first back surface conductive portion is electrically connected to the second back surface conductive portion;

the first head surface conductive portion and the primary-side circuit are electrically connected by the first pad;

the second head surface conductive portion and the secondary-side circuit are electrically connected by the second pad;

wherein the signal transmission device is configured to transmit a signal from the primary-side circuit to the secondary-side circuit through a transformer including the first insulation element and the second insulation element connected in series; and wherein the insulation plate has a thickness that is greater than both a distance between the first head surface conductive portion and the first back surface conductive portion in the thickness direction of the element insulation layer and a distance between the second head surface conductive portion and the second back surface conductive portion in the thickness direction of the element insulation layer.

2. The signal transmission device according to claim 1, wherein the insulation plate is mounted on the primary-side die pad.

3. The signal transmission device according to claim 1, wherein the insulation plate is mounted on the secondary-side die pad.

4. The signal transmission device according to claim 1, wherein the insulation plate is formed by an insulation substrate containing alumina, formed by an insulation substrate containing glass, or formed from an insulation resin.

5. The signal transmission device according to claim 1, wherein the first back surface conductive portion and the second back surface conductive portion are located at the same position in the thickness direction of the element insulation layer.

6. The signal transmission device according to claim 1, wherein a distance between the first head surface conductive portion and the first back surface conductive portion in the thickness direction of the element insulation layer is equal to a distance between the second head surface conductive portion and the second back surface conductive portion in the thickness direction of the element insulation layer.

7. The signal transmission device according to claim 1, wherein:

the first head surface conductive portion includes a spiral or annular first head surface coil;

the first back surface conductive portion includes a spiral or annular first back surface coil;

the second head surface conductive portion includes a spiral or annular second head surface coil; and the second back surface conductive portion includes a spiral or annular second back surface coil.

8. The signal transmission device according to claim 7, wherein:

the first pad is located away from a center of the first head surface coil as viewed in the thickness direction of the element insulation layer; and the second pad is located away from a center of the second head surface coil as viewed in the thickness direction of the element insulation layer.

9. The signal transmission device according to claim 8, wherein:

the first pad is located at an inner side of the first head surface coil as viewed in the thickness direction of the element insulation layer; and the second pad is located at an inner side of the second head surface coil as viewed in the thickness direction of the element insulation layer.

10. The signal transmission device according to claim 7, wherein:

the first back surface coil and the second back surface coil are located at the same position in the thickness direction of the element insulation layer;

the insulation chip includes a first looped conductive portion and a second looped conductive portion that are arranged in the element insulation layer;

the first looped conductive portion has a looped form including an annular first opposing portion and an annular second opposing portion that are open toward each other and a connection portion that connect open ends of the two opposing portions;

the first opposing portion forms the first back surface coil and faces the first head surface coil in the thickness direction of the element insulation layer;

the second opposing portion forms the second back surface coil and faces the second head surface coil in the thickness direction of the element insulation layer; and the second looped conductive portion is similar to the first looped conductive portion and surrounds the first looped conductive portion as viewed in the thickness direction of the element insulation layer.

11. The signal transmission device according to claim 7, wherein:

the first head surface coil and the second head surface coil are both formed from a material containing copper; and the first back surface coil and the second back surface coil are both formed from a material containing aluminum.

12. The signal transmission device according to claim 7, wherein:

the transformer includes a first signal transformer and a second signal transformer;

the signal transmitted through the transformer includes a first signal and a second signal;

the first signal is transmitted through the first signal transformer from the primary-side circuit to the secondary-side circuit; and the second signal is transmitted through the second signal transformer from the primary-side circuit to the secondary-side circuit.

13. The signal transmission device according to claim 12, wherein:

the primary-side die pad and the secondary-side die pad are separated by a gap as viewed in the thickness direction of the element insulation layer;

the first chip, the second chip, and the insulation chip are separated by a gap from one another in a first direction that is a direction in which the primary-side die pad and the secondary-side die pad are arranged;

the first head surface coil and the second head surface coil are separated by a gap in the first direction;

the first back surface coil and the second back surface coil are separated by a gap in the first direction;

the first head surface coil of the first signal transformer and the first head surface coil of the second signal transformer are separated by a gap in a second direction that is orthogonal to the first direction as viewed in the thickness direction of the element insulation layer;

the second head surface coil of the first signal transformer and the second head surface coil of the second signal transformer are separated by a gap in the second direction;

the first back surface coil of the first signal transformer and the first back surface coil of the second signal transformer are separated by a gap in the second direction; and the second back surface coil of the first signal transformer and the second back surface coil of the second signal transformer are separated by a gap in the second direction.

14. The signal transmission device according to claim 13, wherein:

a third pad and a fourth pad are formed on the head surface of the element insulation layer;

the third pad is located between the first head surface coil of the first signal transformer and the first head surface coil of the second signal transformer as viewed in the thickness direction of the element insulation layer, and electrically connected to the first head surface coil of the first signal transformer and the first head surface coil of the second signal transformer; and the fourth pad is located between the second head surface coil of the first signal transformer and the second head surface coil of the second signal transformer as viewed in the thickness direction of the element insulation layer, and electrically connected to the second head surface coil of the first signal transformer and the second head surface coil of the second signal transformer.

15. An insulated module of a signal transmission device, comprising:

an element insulation layer; and an insulation unit including a first insulation element and a second insulation element that are embedded in the element insulation layer connected in series, wherein:

the element insulation layer includes a head surface on which a first pad and a second pad are formed, and a back surface at a side opposite the head surface;

the first insulation element includes a first head surface conductive portion located in the element insulation layer closer to the head surface than to the back surface and electrically connected to the first pad, and a first back surface conductive portion located in the element insulation layer closer to the back surface than to the head surface, the first back surface conductive portion facing the first head surface conductive portion in a thickness direction of the element insulation layer;

the second insulation element includes a second head surface conductive portion located in the element insulation layer closer to the head surface than to the back surface and electrically connected to the second pad, and a second back surface conductive portion located in the element insulation layer closer to the back surface than to the head surface and facing the second head surface conductive portion in the thickness direction of the element insulation layer; and the first back surface conductive portion is electrically connected to the second back surface conductive portion;

wherein an insulation plate located between a primary-side die pad and the insulation module or between a secondary-side die pad and the insulation module of the signal transmission device; and wherein the insulation plate has a thickness that is greater than both a distance between the first head surface conductive portion and the first back surface conductive portion in the thickness direction of the element insulation layer and a distance between the second head surface conductive portion and the second back surface conductive portion in the thickness direction of the element insulation layer.

* * * * *